US009076541B2

(12) United States Patent
Ong et al.

(10) Patent No.: US 9,076,541 B2
(45) Date of Patent: Jul. 7, 2015

(54) ARCHITECTURE FOR MAGNETIC MEMORIES INCLUDING MAGNETIC TUNNELING JUNCTIONS USING SPIN-ORBIT INTERACTION BASED SWITCHING

(71) Applicant: Samsung Electronics Co., LTD., Gyeonggi-do (KR)

(72) Inventors: Adrian E. Ong, Pleasanton, CA (US); Alexey Vasilyevitch Khvalkovskiy, Milpitas, CA (US); Dmytro Apalkov, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 175 days.

(21) Appl. No.: 13/851,274

(22) Filed: Mar. 27, 2013

(65) Prior Publication Data

US 2014/0269032 A1    Sep. 18, 2014

Related U.S. Application Data

(60) Provisional application No. 61/785,908, filed on Mar. 14, 2013, provisional application No. 61/798,578, filed on Mar. 15, 2013.

(51) Int. Cl.
*G11C 11/00* (2006.01)
*G11C 11/14* (2006.01)
*G11C 11/15* (2006.01)
*G11C 11/16* (2006.01)

(52) U.S. Cl.
CPC .......... *G11C 11/1673* (2013.01); *G11C 11/16* (2013.01); *G11C 11/1675* (2013.01)

(58) Field of Classification Search
USPC ........................................ 365/158, 171, 173
See application file for complete search history.

(56) References Cited

U.S. PATENT DOCUMENTS

| | | | |
|---|---|---|---|
| 6,081,445 A | 6/2000 | Shi et al. | |
| 6,738,303 B1 | 5/2004 | Subramanian et al. | |
| 6,842,363 B2 | 1/2005 | Thewes et al. | |
| 7,038,959 B2 | 5/2006 | Garni | |
| 7,436,698 B2 | 10/2008 | Lin et al. | |
| 7,796,419 B2 | 9/2010 | Koga | |
| 8,045,370 B2 | 10/2011 | Zhu et al. | |
| 8,385,106 B2 * | 2/2013 | Ong | 365/158 |

(Continued)

OTHER PUBLICATIONS

Liu, Lugiao et al., "Spin-Torque Switching with the Giant Spin Hall Effect of Tantalum," Science, 336,555 (2012).

*Primary Examiner* — Trong Phan
(74) *Attorney, Agent, or Firm* — Convergent Law Group LLP

(57) ABSTRACT

A magnetic memory includes memory array tiles (MATs), intermediate circuitry, global bit lines and global circuitry. Each MAT includes bit lines, word lines, and magnetic storage cells having magnetic junction(s), selection device(s) and at least part of a spin-orbit interaction (SO) active layer adjacent to the magnetic junction(s). The SO active layer exerts a SO torque on the magnetic junction(s) due to a preconditioning current passing through the SO active layer. The magnetic junction(s) are programmable using write current(s) driven through the magnetic junction(s) and the preconditioning current. The bit and word lines correspond to the magnetic storage cells. The intermediate circuitry controls read and write operations within the MATs. Each global bit line corresponds to a portion of the MATs. The global circuitry selects and drivesportions of the global bit lines for read operations and write operations.

25 Claims, 17 Drawing Sheets

(56) References Cited

U.S. PATENT DOCUMENTS

| | | |
|---|---|---|
| 8,416,618 B2 * | 4/2013 | Gaudin et al. ............... 365/158 |
| 8,467,235 B2 * | 6/2013 | Slonczewski ............... 365/158 |
| 8,508,984 B2 * | 8/2013 | Ranjan et al. ............... 365/158 |
| 8,520,433 B1 * | 8/2013 | Kato et al. ............... 365/158 |
| 8,680,632 B2 * | 3/2014 | Daibou et al. ............... 365/158 |
| 8,699,264 B2 * | 4/2014 | Yamane et al. ............... 365/158 |
| 8,711,600 B2 * | 4/2014 | Venkataraman et al. ...... 365/171 |
| 8,755,222 B2 * | 6/2014 | Kent et al. ............... 365/171 |
| 8,860,156 B2 * | 10/2014 | Beach et al. ............... 365/171 |
| 2010/0246244 A1 | 9/2010 | Shimomura et al. |

\* cited by examiner

ARCHITECTURE FOR MAGNETIC MEMORIES INCLUDING MAGNETIC TUNNELING JUNCTIONS USING SPIN-ORBIT INTERACTION BASED SWITCHING

CROSS-REFERENCE TO RELATED APPLICATIONS

This application claims the benefit of provisional Patent Application Ser. No. 61/785,908, filed Mar. 14, 2013, entitled ARCHITECTURE FOR MAGNETIC MEMORIES INCLUDING MAGNETIC TUNNELING JUNCTIONS USING SPIN-ORBIT INTERACTION BASED SWITCHING, assigned to the assignee of the present application, and incorporated herein by reference. This application also claims the benefit of provisional Patent Application Ser. No. 61/798,578, filed Mar. 15, 2013, entitled ARCHITECTURE FOR MAGNETIC MEMORIES INCLUDING MAGNETIC TUNNELING JUNCTIONS USING SPIN-ORBIT INTERACTION BASED SWITCHING, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state. Conventional STT-RAM is desired to combine the fast read and write speed of SRAM, the capacity and cost benefits of DRAM, and the non-volatility of Flash (zero standby power), coupled with essentially unlimited endurance (for example greater than $10^{15}$ cycle). As described below, STT-RAM uses a bi-directional current to write data. Such write operations may be performed without assistance from magnetic field, heat, or other sources of energy. Consequently, STT-RAM may have the lowest writing energy of emerging memory technologies.

For example, FIGS. 1-2 depicts a conventional magnetic tunneling junction (MTJ) 10 as it may be used in a conventional STT-RAM 50. FIG. 1 is a diagram of the conventional MTJ 10, while FIG. 2 depicts the circuit diagram of part of the conventional STT-RAM 50 including the conventional MTJ 10. The conventional MTJ 10 typically resides on a bottom contact 11, uses conventional seed layer(s) 12 and includes a conventional antiferromagnetic (AFM) layer 14, a conventional pinned, or reference layer 16 having a magnetic moment 17, a conventional tunneling barrier layer 18, a conventional free layer 20, and a conventional capping layer 22. Also shown is top contact 24. Top and bottom contacts may be coupled to the selection device 62 depicted in FIG. 2.

The conventional STT-RAM 50 includes a conventional magnetic storage cell 60 including the conventional MTJ 10 and a selection device 62. The selection device 62 is generally a transistor such as a NMOS transistor and includes a drain 66, a source 64, and a gate 68. Also depicted are a word line 72, a bit line 74, and source line 70. The word line 72 is oriented perpendicular to the bit line 74. The source line 70 is typically either parallel or perpendicular to the bit line 74, depending on specific architecture used for the conventional STT-RAM 1. The bit line 74 is connected to the MTJ 10, while the source line 70 is connected to the source 64 of the selection device 62. The word line 72 is connected to the gate 68.

The conventional STT-RAM 50 programs the magnetic memory cell 60 by driving a bi-directional current through the cell 60. In particular, the MTJ 10 is configured to be changeable between high and low resistance states by a current flowing through the conventional MTJ 10. For example, the MTJ 10 may be a magnetic tunneling junction (MTJ) or other magnetic structure that may be written using the spin transfer effect. Typically, this is achieved by ensuring that the MTJ 10 has, for example, a sufficiently small cross-sectional area as well as other features desirable for switching using the spin transfer effect. When the current density is sufficiently large, the current carriers driven through the MTJ 10 may impart sufficient torque to change the state of the MTJ 10. When the write current, such as $I_{w1}$, is driven in one direction, the state may be changed from a low resistance state to a high resistance state. When the write current, such as $I_{w2}$, is passed through the MTJ 10 in the opposite direction, the state may be changed from a high resistance state to a low resistance state.

During write operations, the word line 72 is high and turns on the selection device 62. The write current flows either from the bit line 74 to the source line 70, or vice versa, depending upon the state to be written to the magnetic memory cell 60. The magnetic moment 21 of the conventional free layer 20 may thus be changed. During read operations, the column decoder (not shown) selects the desired bit lines 74. A row decoder (not shown in FIG. 2) also enables the appropriate word line(s) 72. Thus, the word line 72 is high, enabling the selection device 62. Consequently, a read current flows from the bit line 74 to the source line 70. In addition to the read current ($I_{Data}$ in FIG. 2) flowing through the cell being read, reference currents are also driven through reference resistors (not shown in FIG. 2). The output signals are provided to a sense amplifier (not shown).

Although the conventional MTJ 10 and STT-RAM 50 may be written using spin transfer and used in an STT-RAM, there are drawbacks. For example, the write error rates may be higher than desired for memories having an acceptable pulse width. The write error rate (WER) is the probability that the cell 60 (i.e. the magnetization 21 of free layer 20 of the conventional magnetic junction) is not switched when subjected to a current that is at least equal to the typical switching current. The WER is desired to be $10^{-9}$ or less. WER of $10^{-21}$ is desired to be compatible with DRAM. However, very high currents can be required to achieve switching of the conventional free layer 20 at this WER value. In addition, it has been determined that the WER may be challenging to improve for shorter write current pulses. For higher pulse widths, the WER versus voltage applied to the MTJ 10 has a higher slope. Thus, application of a higher voltage for the same pulse width may bring about a significant reduction in the WER. However, as the pulse widths shorten, the slope of the WER curves decreases. For a decreasing pulse width, an increase in voltage and/or current is less likely to bring about a reduction in the WER. At sufficiently short pulses, even high voltages/currents do not result in a lower error rate. Consequently, memories employing the conventional MTJ 10 may have unacceptably high WER that may not be cured by an increase in voltage.

Furthermore, although a single magnetic tunneling junction is shown in FIG. 1, dual magnetic tunneling junctions are often used to obtain a sufficiently high spin transfer torque for switching. The dual magnetic tunneling junction has a single free layer sandwiched by two tunneling barrier layers. Each tunneling barrier layer is between the free layer and a reference layer. The second (upper) tunneling barrier of a dual magnetic tunneling junction may be challenging to grow with a suitable crystal structure. Further, to obtain such a high torque the reference layers have their magnetic moments fixed in opposite directions. As a result, there is cancellation of magnetoresistance, which lowers the read signal. Such a reduction in signal is undesirable.

Moreover, it is desirable to provide an STT-RAM that is scalable and has sufficiently fast access times to continue development as a next-generation nonvolatile memory. Providing such a memory given the challenges described above may be difficult or impossible.

Accordingly, what is needed is a method and system that may improve the performance of the spin transfer torque based memories. The method and system described herein address such a need.

BRIEF SUMMARY OF THE INVENTION

A method and system provide a magnetic memory including memory array tiles (MATs), intermediate circuitry, global bit lines and global circuitry. Each MAT includes bit lines, word lines, and magnetic storage cells having at least one magnetic junction, at least one selection device and at least part of a spin-orbit interaction (SO) active layer adjacent to the magnetic junction(s). The SO active layer is configured to exert a SO torque on at least part of the magnetic junction(s) due to an SO current passing through the SO active layer. The magnetic junction(s) are programmable using write current (s) driven through the magnetic junction(s) and the SO current. The bit lines and the word lines correspond to the magnetic storage cells. The intermediate circuitry controls read and write operations within the MATs. Each global bit line corresponds to a portion of the MATs. The global circuitry selects and drives a portion of the global bit lines for the read and write operations.

According to the method and system disclosed herein, the present invention provides a magnetic memory employing a hierarchical architecture and which may be written using a spin-orbit interaction in conjunction with spin transfer torque.

DETAILED DESCRIPTION OF THE INVENTION

Figure 1:
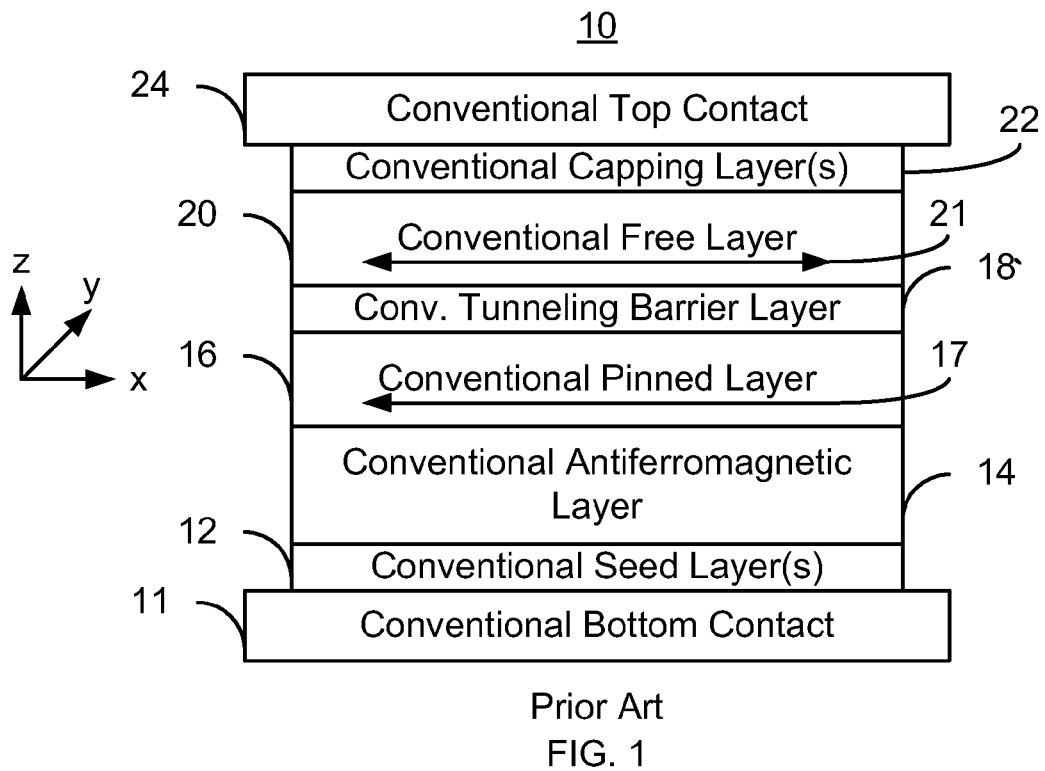
FIG. 1 depicts a conventional magnetic junction.
Figure 2:
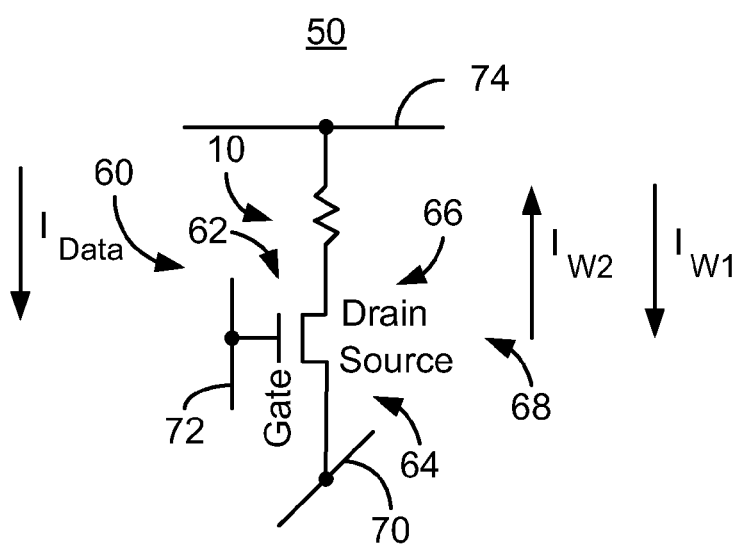
FIG. 2 a portion of a conventional spin transfer torque random access memory.

The exemplary embodiments relate to magnetic memories as well as magnetic junctions usable such magnetic memories. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments describe magnetic memories and methods for providing and programming the magnetic memories. The magnetic memory includes memory array tiles (MATs), intermediate circuitry, global bit lines and global circuitry. Each MAT includes bit lines, word lines, and magnetic storage cells having at least one magnetic junction, at least one selection device and at least part of a spin-orbit interaction (SO) active layer adjacent to the magnetic junction(s). The SO active layer is configured to exert a SO torque on at least part of the magnetic junction(s) due to a SO current passing through the SO active layer. The magnetic junction(s) are programmable using write current(s) driven through the magnetic junction(s) and the SO current. The bit lines and the word lines correspond to the magnetic storage cells. The intermediate circuitry controls read and write operations within the MATs. Each global bit line corresponds to a portion of the MATs. The global circuitry selects and drives a portion of the global bit lines for the read and write operations.

In conjunction with the magnetic memories, the exemplary embodiments describe methods and systems for providing a magnetic junction switched via spin-orbit interaction. The magnetic junction includes a data storage layer that is magnetic and corresponds to spin-orbit interaction (SO) active layer(s). The SO active layer(s) are adjacent to the data storage (e.g. free) layer of the magnetic junction. The at SO active layer(s) are configured to exert a SO torque on the data storage layer due to a current passing through the at least one SO active layer in a direction substantially perpendicular to a direction between the at least one SO active layer and the data storage layer of a magnetic junction of the plurality of magnetic junctions closest to the at least one SO active layer. The data storage layer is configured to be switchable using at least the SO torque.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of spin-orbit interaction, the spin transfer phenomenon, of magnetic anisotropy, and other physical phenomenon. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit active layers, and/or other structures having particular layers. However, one of ordinary skill in the art will readily recognize that magnetic junctions, spin-orbit active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
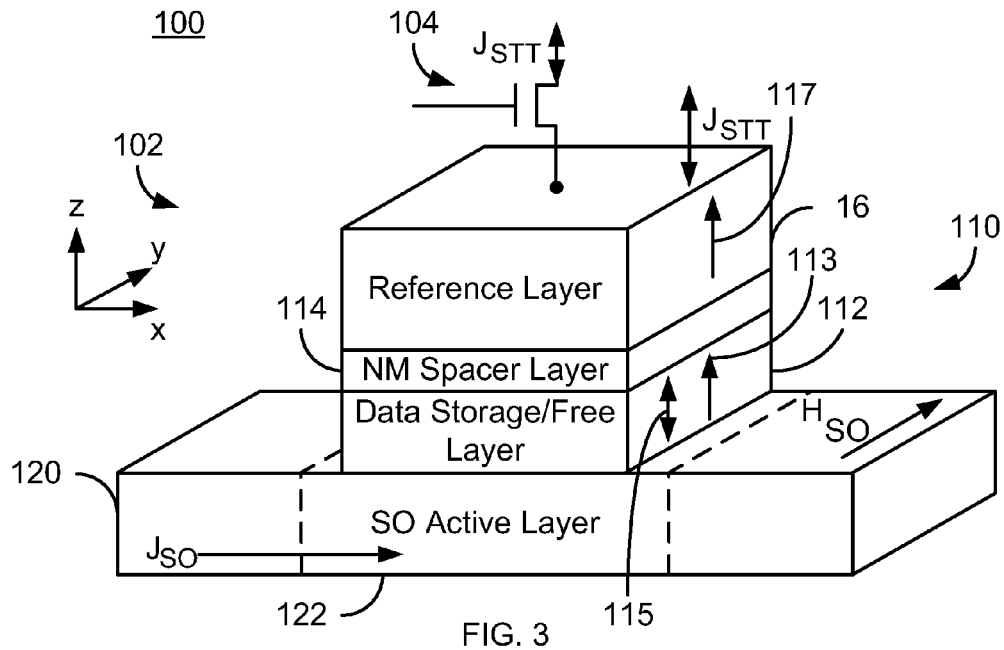
FIG. 3 depicts an exemplary embodiment of a magnetic junction switched using spin-orbit interaction.

FIG. 3 depicts an exemplary embodiment of a portion of a magnetic memory 100 that utilizes spin-orbit interaction in switching. For clarity, FIG. 3 is not to scale. In addition, portions of the magnetic memory 100 such as bit lines, word lines, row selectors and column selectors are not shown or not labeled as such. The magnetic memory 100 includes a magnetic storage cell 102. The magnetic storage cell 102 may be one of a number of magnetic storage cells ordered in an array. Each of the magnetic storage cells includes a selection device 104 and a magnetic junction 110. In some embodiments, multiple magnetic junctions 110 and/or multiple selection devices 104 may be used in a single cell. Also shown is bus 120 including a spin-orbit interaction (SO) active layer 122. The common bus 120 stretches across multiple storage cells, of which only one is shown in FIG. 3. In the embodiment shown, the material(s) forming the SO active layer 122 are only in the vicinity of the storage cell 102. Thus, other materials, including but not limited to higher conductivity and/or nonmagnetic materials, may be used between the cells 102. However, in other embodiments, the common bus 120 may consist of the SO active layer 122. In still other embodiments, the SO active layer 122 may be separate from the common bus 120. For example, the SO active layer 122 may reside between the magnetic junction 110 and the common bus 120. In other embodiments, the SO active layer 122 may be included as part of the storage cell 102 and the common bus 120 might be omitted.

In the embodiment shown, the magnetic junction 110 includes a data storage layer 112, a nonmagnetic spacer layer 114, and a reference layer 116. The spacer layer 114 is nonmagnetic. In some embodiments, the spacer layer 114 is an insulator, for example a tunneling barrier. In such embodiments, each spacer layer 114 may include crystalline MgO, which may enhance the TMR and spin transfer efficiency of and/or the spin-orbit interaction for the magnetic junction 110. In other embodiments, the spacer layer 114 may be a conductor, such as Cu. In alternate embodiments, the spacer layer 114 might have another structure, for example a granular layer including conductive channels in an insulating matrix.

The data storage layer 112 is a free layer 112 having a magnetic moment 115 that is switchable. When the magnetic junction 110 is quiescent (not being switched), the magnetic moment of the free layer 112 lies along the easy axis of the free layer 112. The magnetic moment 117 of the reference layer 116 is desired to be substantially fixed in place during operation of the magnetic memory 100. The reference layer 116 is depicted as a single layer. However, in other embodiments, the reference layer 116 may be a multilayer including, but not limited to a synthetic antiferromagnet having ferromagnetic layers separated by nonmagnetic layer(s) that may be Ru. In some embodiments, the magnetic junction 110 also includes a pinning layer, such as an antiferromagnetic layer (not shown) that fixes the magnetic moment 117 of the reference layer 116 in place. In other embodiments, the magnetic moment of the reference layer 116 is fixed in another manner. The free and reference layers 112 and 116 are ferromagnetic and thus may include one or more of Fe, Ni, and Co. Although magnetic moments are not shown, the magnetic moments of the layers 112 and 116 may be perpendicular to plane in some embodiments. Thus, each of the layers 112 and/or 116 may have a perpendicular anisotropy field that exceeds its out-of-plane demagnetization field (typically a significant fraction of $4\pi M_s$). In other embodiments, the magnetic moments are in plane.

The magnetic moment of the free layer 112 is switched using the spin-orbit interaction effect, described below. In some embodiments, the free layer 112 may be switched using a combination of effects. For example, the magnetic moment of the free layer 112 may be switched using spin transfer torque as a primary effect that may be assisted by torque induced by the spin-orbit interaction. However, in other embodiments, the primary switching mechanism is torque induced by the spin-orbit interaction. In such embodiments, another effect including but not limited to spin transfer torque, may assist in switching and/or selecting the magnetic junction 110. In still other embodiments, the free layer 112 magnetic moment is switched using only the spin-orbit interaction effect.

The SO active layer 122 is a layer that has a strong spin-orbit interaction and that can be used in switching the magnetic moment of the free layer 112. The SO active layer 122 may be used in generating a spin-orbit field $H_{SO}$. More specifically, a current is driven in plane through the SO active layer 122. This may be achieved by driving a current (e.g. $J_{SO}$) through the common bus 120. The current through the SO active layer 122 has an associated spin-orbit interaction that may result in the spin-orbit field $H_{SO}$. This spin-orbit field $H_{SO}$ is equivalent, to the spin-orbit torque, $T_{SO}$, on the magnetic moment 115. The spin-orbit torque on the free layer 112 is given by $T_{SO} = -\gamma[M \times H_{SO}]$, where M is the magnitude of the magnetic moment 115. This mutually correlated torque and field are thus interchangeably referred to herein as spin-orbit field and spin-orbit torque. This reflects the fact that the spin-orbit interaction is the origin of the spin-orbit torque and spin-orbit field. This terminology also differentiates this spin-orbit (SO) torque from the more conventional spin-transfer torque (STT). Spin-orbit torque occurs for a current driven in plane in the SO active layer 122 and a spin-orbit interaction. For example, in the embodiment shown, the spin-orbit torque occurs for the current density $J_{SO}$. In contrast, spin transfer torque is due to a perpendicular-to-plane current flowing through the free layer 112, spacer layer 114 and reference layer 116, that injects spin polarized charge carriers into the free layer 112. In the embodiment shown, the spin transfer torque is due to the current density $J_{STT}$. The spin-orbit torque $T_{SO}$ may rapidly deflect the magnetic moment of the free layer 112 from its equilibrium state parallel to the easy axis. The spin-orbit torque $T_{SO}$ may tilt the magnetization of the free layer considerably faster than conventional STT torque of similar maximum amplitude. In some embodiments, another mechanism such as spin transfer may be used to complete switching. In other embodiments, switching can be completed using spin-orbit torque. The spin-orbit field/spin-orbit torque generated may thus be used in switching the magnetic moment of the free layer 112.

In some embodiments, the SO interaction may include some combination of two effects: the spin Hall effect and the Rashba effect. In many SO active layers, the spin-orbit interaction includes both the spin Hall effect and the Rashba effect, but one of the two dominates. Other spin-orbit effects may also be employed. The spin Hall effect is generally considered to be a bulk effect. Materials that exhibit the spin Hall effect often include heavy metals or materials doped by heavy metals. For example, such materials can be selected from A and M doped by B. A includes Y, Zr, Nb, Mo, Tc, Ru, Rh, Pd, Cd, In, Sb, Te, Hf, Ta (including high-resistive amorphous β-Ta), W, Re, Os, Ir, Pt, Au, Hg, Tl, Pb, Bi, Po, At, and/or their combinations; M includes at least one of Al, Ti, V, Cr, Mn, Cu, Zn, Ag, Hf, Ta, W, Re, Pt, Au, Hg, Pb, Si, Ga, GaMn or GaAs, and B includes at least one of V, Cr, Mn, Fe, Co, Ni, P, S, Zn, Ga, Ge, As, Se, Y, Zr, Nb, Mo, Tc, Ru, Rh, Pd, Ag, Cd, In Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb. In some embodiments, the SO active layer 122 may include or consist of Ir doped Cu and/or Bi doped Cu. The doping is generally in the range of 0.1 through 10 atomic percent. In other embodiments, other materials may be used.

Another source of the spin-orbit field $H_{SO}$ in the SO active layer 122 can be related to the spin-orbit interaction at the interfaces. The magnitude of the spin-orbit field in this case is often related to the magnitude of the crystal field, which is often high at the interface. Due to the mismatch of the lattice parameters of the adjacent layers, the presence of heavy metals at the interface, and other effects, the spin-orbit interaction can be considerably large at some interfaces. A strong spin-orbit effect at the interface associated with the gradient of the crystal field in the perpendicular to the interface plane direction is often referred to as the Rashba effect. As used herein, however, the Rashba effect refers to a spin-orbit interaction at the interface regardless of its origin and direction. Note that in at least some embodiments, the interfaces for the SO active layer 122 should differ to get a sizable Rashba effect. For example, the Rashba effect may occur for the SO active layer 122 being/having a Pt layer adjoining the magnetic junction 110, a Co layer for the free layer 112, and an aluminum oxide or MgO nonmagnetic layer 114. In some embodiments, other materials may be used.

The effect of the spin-orbit interaction at the interface (i.e. the Rashba effect) on the magnetization is twofold. First, the spin accumulation can build up at the interface. The unit vector of spin-polarization of this spin accumulation $p_{SO}$ for the Rashba effect is typically perpendicular to the crystal field and the current direction. Many SO active layers 122 have a crystal field perpendicular to the plane of the layer 120. As such, the spin-orbit polarization would be in plane, for example in the direction of $H_{SO}$ in FIG. 3. Alternatively, the SO active layer 122 may have a crystalline field in plane or tilted to the plane. As such, the SO active layer 122 has a spin-orbit polarization perpendicular to plane (not shown in FIG. 3) or correspondingly tilted to the plane (not shown in FIG. 3). In such embodiments, the SO active layer 122 may be a surface alloy. For example the SO active layer 122 may include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and/or their combinations. In other embodiments, the SO active layer 122 may include surface alloys of A/B, e.g. atoms of A residing on a (111) surface of a host material B such that on the top atomic layers are a mixture of A and B. A includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, Yb, and B includes at least one of Si, Zn, Cu, Ag, Au, W, Zn, Cr, Pt, Pd. In many embodiments, A includes two or three different materials. In some embodiments, at least 0.1 to not more than three monolayers of A are deposited. In some such embodiments approximately ⅓ of a monolayer of A is deposited. In some embodiments, this can be one or more of substitutional Bi/Ag, substitutional Pb/Ag, substitutional Sb/Ag, substitutional Bi/Si, substitutional Ag/Pt, substitutional Pb/Ge, substitutional Bi/Cu, and a bilayer including a layer residing on a (111) surface of Au, Ag, Cu or Si. In other embodiments, the SO active layer 122 may include compounds like InGaAs, HgCdTe or bilayers $LaAlO_3/SrTiO_3$, $LaTiO_3/SrTiO_3$. In other embodiments, other materials may be used. For some embodiments, Rashba effect would result in the spin-orbit torque $T_{SO}$ and corresponding spin-orbit field $H_{SO}$ on the free layer 112.

If the unit polarization vector $p_{SO}$ due to the Rashba effect is parallel to the easy axis of the free layer 112, then the Rashba effect may be used in switching of the magnetic junction 110, similarly to what is described for the spin Hall effect. To switch the free layer 112, therefore, an in-plane current pulse ($J_{SO}$) is driven through the SO active layer 122. The current pulse generates the spin-orbit field $H_{SO}$ in the manner described above. The SO torque would oppose the magnetic damping torque, and can switch magnetization of the free layer in an analogous manner to STT and similarly to what is discussed above for the spin-Hall effect. If both Hall and Rashba components of the spin-orbit field are present, two effects can help each other. Note that in former case ($T_{SO}$ is overcoming the damping term), spin-orbit field $H_{SO}$ typically can be $1/\alpha$ times smaller than what is required for the latter case ($H_{SO}$ overcoming the anisotropy field Hk), where $\alpha$ is the Gilbert damping constant of the free layer, typically 0.001-0.05.

Thus, the magnetic memory 100 may use spin-orbit interaction and the spin-orbit field generated by the SO layer 120 in switching of the magnetic moment of the free layer 112. In some embodiments, the SO active layer 122 may rely one or both of the spin-Hall effect and the Rashba effect to generate the spin-orbit field $H_{SO}$. Consequently, as used herein, terms such as the "spin-orbit effect", "spin-orbit field and/or "spin-orbit interactions" may include spin-orbit coupling via the Rashba effect, the spin Hall effect, some combination of the two effects, and/or some other spin-orbit interaction or spin-orbit interaction-like effect. The spin-orbit fields can exert a torque on the magnetic moment of the data storage/free layer 112. This spin-orbit torque can be used in switching the magnetic moment of the free layer 112. In some embodiments, the spin-orbit field assists in switching the magnetic moment of the free layer 112. Another mechanism, such as spin transfer torque, is the primary switching mechanism. In other embodiments, the spin-orbit torque is the primary switching mechanism for the magnetic moment of the free layer 112. However, in some such embodiments, the spin-orbit torque may be assisted by another mechanism such as spin transfer torque. The assistance may be in switching the magnetic moment of the free layer 112 and/or in selecting the magnetic junction to be switched.

Because the spin-orbit torque may be used in switching the magnetic moment of the free layer 112, performance of the memory 100 may be improved. As discussed above, the spin-orbit torque generated by the SO active layer 122 may reduce the switching time of the magnetic junction 110. The spin-orbit torque typically has a high efficiency $P_{SO}$ and is proportional to the current $J_{SO}$. Because this current density is in plane and does not flow through the spacer layer 114, this spin-orbit current may be increased without damage to the magnetic junction 110. As a result, the spin-orbit field and spin-orbit torque may be increased. Thus, the write time may be reduced and the write error rate improved. Thus performance of the memory 100 may be improved.

In order to make use of the SO torque in switching the magnetic junction 110 and writing to the magnetic storage cell 102 in the magnetic memory 100, particular circuitry may be desired. Further, the circuitry used in connection with the memory 100 may be desired not only to make use of the spin-orbit interaction, but also provide other benefits.

Figure 4:
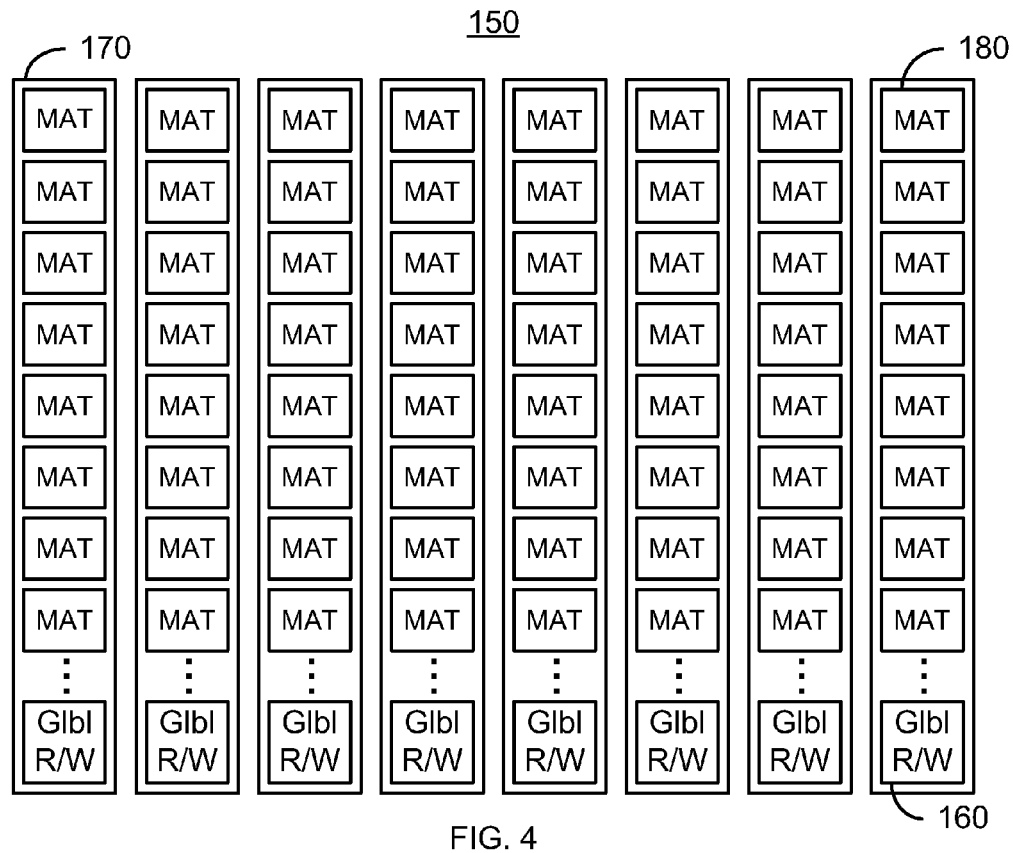
FIG. 4 depicts an exemplary embodiment of a portion of a magnetic memory employing the spin transfer effect in connection with the spin-orbit interaction for switching.
Figure 5:
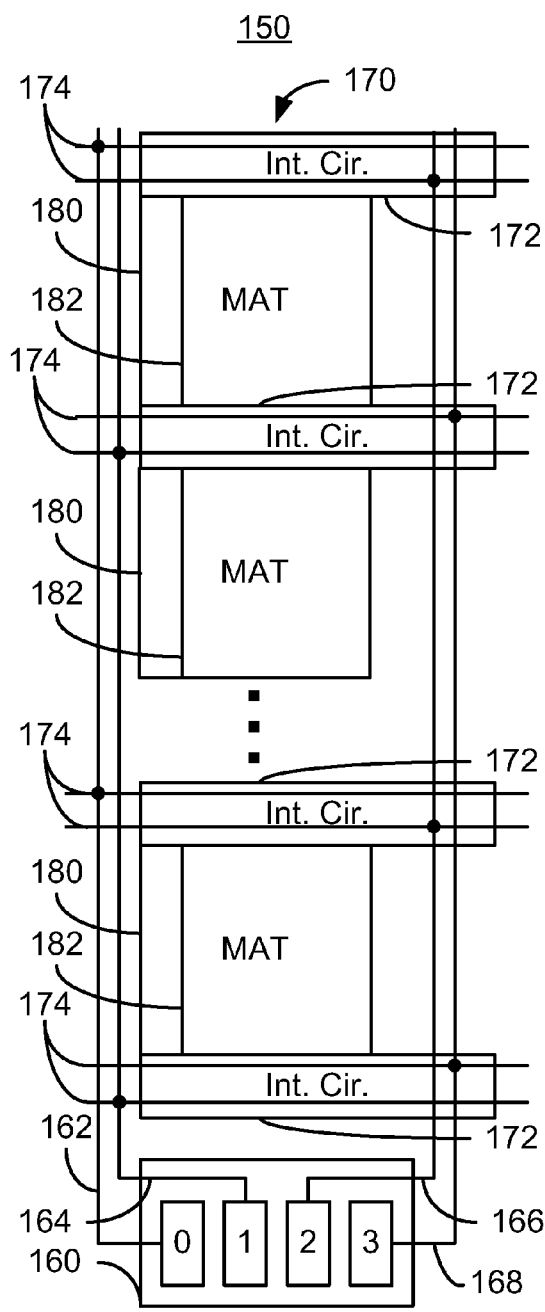
FIG. 5 depicts another exemplary embodiment of a portion of a magnetic memory employing the spin transfer effect in connection with the spin-orbit interaction for switching.

FIGS. 4-5 are diagrams of an exemplary embodiment of a portion of a magnetic memory 150 employing the spin-orbit interaction in writing. FIG. 4 is a higher level view of the magnetic memory 150 including global circuitry (GBL R/W) 160, subarrays 170 and memory array tiles (MATs) 180. FIG. 5 depicts one subarray 170. The MATs 180 are organized in subarrays 170. Each MAT 180 includes a number of storage cells such as the cell 102 and SO active layers analogous to the SO active layer 122 depicted in FIG. 3. The storage cells within a MAT 180 may also be organized in an array. Referring back to FIGS. 4-5, the MAT 110 also includes bit lines and word lines. The bit lines and word lines may be parallel or perpendicular. In some embodiments, the magnetic storage cells are located cross points of the bit lines and word lines. In some embodiments, bitlines and word lines may be drawn at half-pitch similar to DRAM. The MAT 180 may also include common buses 182 that are used to drive the SO active layer 122 depicted in FIG. 3. Although only one common bus 182 is shown in FIG. 5, the MAT 180 typically has numerous buses. The common bus 182 may be used to carry a unidirectional or bidirectional precharge current. The precharge current is used to generate the SO field that may drive the magnetic junction 110 from its stagnation point. In the embodiment shown, the common bus 182 is parallel to global bit lines 162, 164, 166 and 168 and perpendicular to intermediate bit lines 174. However, in other embodiments, other orientations of the common bus 182 are possible. The magnetic memory 150 is thus hierarchically organized. In some embodiments, the memory 150 also employs the spin transfer effect as a primary or secondary writing mechanism. In some embodiments, the spin-orbit interaction is used to increase switching speed by driving the magnetic moment of the data storage layer away from the stagnation point. Stated differently, the spin-orbit interaction may be used to cant the magnetic moment of the free layer from the easy axis. Spin transfer torque may then be used in switching magnetic junction. Because the spin transfer effect may be considered the primary switching mechanism, the magnetic memory 150 may be considered a STT-RAM.

The global circuitry 160 is coupled with the MATs via global bit lines 162, 164, 166 and 168. In some embodiments, the global bit lines 162, 164, 166 and 168 actually correspond to global bit line-source line pairs. Thus, as used herein, a global bit line could be a single bit line or a bit line-source line pair. Using modules 0, 1, 2, 3 and 4, the global circuitry 160 selects and drives one or more of the global bit lines 162, 164, 166 and 168, respectively, which may be used to select one or more of the MATs 180. The global bit lines 162, 164, 166 and 168 are selectively driven for read and write operations of the MATs 180 in each subarray 170. Although four global bit lines 162, 164, 166 and 168 are shown per subarray 170, another number might be used. Further, although a particular number of subarrays 170 and MATs 180 within each subarray 170 are shown, another number may be used. In addition to the MATs, each subarray 170 includes intermediate circuitry (Int. Cir.) 172 that drives intermediate bit lines 174. In some embodiments, the intermediate bit lines 174 actually correspond to intermediate bit line-source line pairs. Thus, as used herein, an intermediate bit line could be a single bit line or a bit line-source line pair. The intermediate circuitry 140 controls writing operation(s) in the MAT 180 above and/or below. Using a combination of the intermediate bit lines 174 and global bit lines 162, 164, 166 and 168, the appropriate MAT(s) 180 may be selected.

Figure 6:
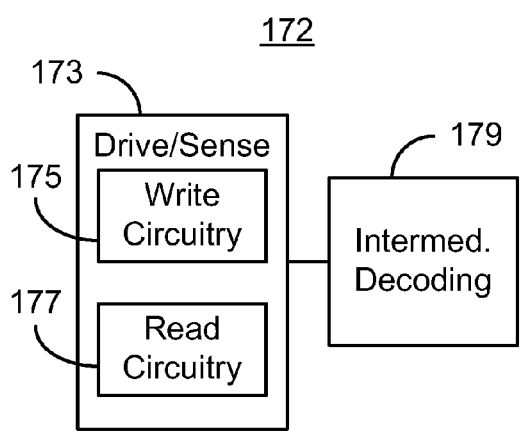
FIG. 6 depicts another exemplary embodiment of a portion of a magnetic memory employing the spin transfer effect in connection with the spin-orbit interaction for switching.

Intermediate circuitry 172 controls read operations and write operations within the corresponding MATs 110. For example, as shown in FIG. 6, the intermediate circuitry 170 may include intermediate decoding circuitry 179 and drive-sense circuitry 173. Decoding circuitry 179 may allow for selection of specific MAT(s) 180 as well as individual word lines and bit lines (and thus selected storage cells) within the MAT(s) 180. Write circuitry 175 may be used to drive write currents and otherwise control write operations within a MAT 180. Similarly, read circuitry 177 may drive a read current, receive an output sense current from the MAT 180 being read, and/or otherwise control read operations in the corresponding MAT(s) 180.

Referring to FIGS. 3-6, in operation, the common buses 122 may be driven with a precharge current. The precharge current generates an SO torque that cants the magnetic moment of the free layer(s) 112 from the easy axis. Thus, the precharge current and SO torque may be viewed as preparing the magnetic junction 110 for faster writing. The precharge current is in-plane and may not travel through the magnetic junction. Using the global circuitry 160 and intermediate circuitry 172, a spin transfer current may then be driven through the magnetic junction(s) 110 in memory cell(s) 102 selected for writing. Thus, spin transfer torque may be considered the primary mechanism for writing to the memory 100/150. However, an SO interaction is also used in writing to the cells in the magnetic memory 100/150.

The memory 150 is hierarchical and modular. The combination of the global bit lines 162, 164, 166 and 168, the MATs 180, the intermediate circuitry 172 and the intermediate bit lines 174 (i.e. subarray 170) may be repeated to scale the magnetic memory 150 up to provide storage of a greater amount of data. Stated differently, modules such as the MATs 180, intermediate circuitry 172 and global circuitry may be duplicated and added to build larger memories. The memory 150 is, therefore, hierarchical in nature. The memory 150 may thus be scalable to larger, more dense memories. Further, the global bit lines 162, 164, 166 and 168 may have a lower resistance than the bit lines and word lines within each MAT 180. Thus, the parasitic resistance may be reduced and/or limited to the MATs 180. Array efficiency may thus be increased with little performance impact. Sense amplifiers may be located in the global circuitry 160. Multiple MATs 180 may also share a set of global sense amplifiers and global writer drivers in the global circuitry 150. In other embodiments, more localized sense amplifiers and/or writer drivers may be used, for example in the intermediate circuitry 172. Use of the intermediate circuitry 172 for sensing signals, driving currents, and decoding within the MATs may reduce read and/or write penalties. Consequently, the memory 150 may be usable in higher density memories.

Figure 7:
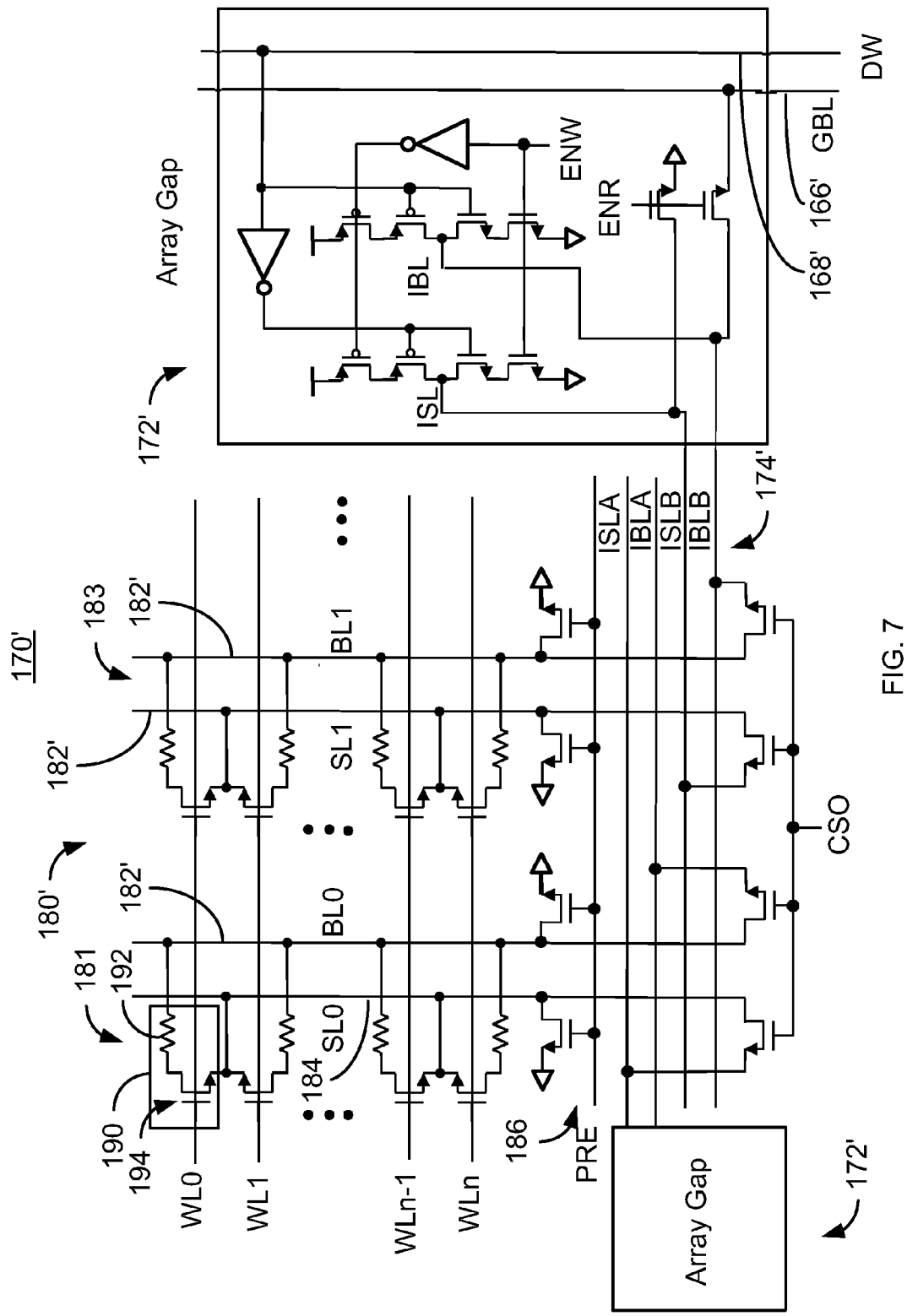
FIG. 7 depicts another exemplary embodiment of a portion of a magnetic memory employing the spin transfer effect in connection with the spin-orbit interaction for switching.

FIG. 7 depicts another exemplary embodiment of a portion of a magnetic memory employing the spin transfer effect in connection with the spin-orbit interaction for switching. In particular, a portion of the subarray 170' is shown. The subarray 170' is analogous to the subarray 170. Consequently, analogous components are similarly labeled. Thus, the subarray 170' includes MAT 180' and intermediate circuitry 172' residing in the array gaps. For clarity, only one MAT 180' is shown. However, a subarray 170' typically includes multiple MATs 180' as well as multiple intermediate circuitry 172' in the array gaps. Also depicted are global lines (GBL) 166' and 168' provided to intermediate circuitry 172'. Global bit lines 166' and 168' as well as signal CSO may be used to control the intermediate circuitry.

Intermediate bit lines 174' (ISLA, IBLA, ISLB and IBLB) are bit line (IBLA and IBLA) and source line (ISLA and ISLB) pairs. The intermediate bit lines 174' connect intermediate circuitry 172' with portions of the MAT 180'. The intermediate circuitry 172' controls the bit lines 174' to select one of the two columns 181 and 183 of the MAT 180' for reading and writing. The MAT 180' includes magnetic storage cells 190, bit lines 182' and source lines 184. For clarity, only one storage cell 190 is labeled. The storage cell 190 includes a magnetic junction 192 and selection device 194 that correspond to the magnetic junction 110 and selection device 104, respectively. The bit lines 182' are connected to the magnetic junctions 192. Thus, the bit lines 182' correspond to the common buses 182 depicted in FIG. 3. The bit lines 182' either include or are adjacent to SO active layers (not explicitly shown in FIG. 7) that are used in writing to the magnetic junctions 192 via SO torque.

In order to write to a cell 190, therefore, selection devices 186 are selected and driven using PRE and CSO signals. Consequently, a SO current is driven in plane through the line 182', resulting in a SO torque on the free layer of the magnetic junction 192. In some embodiments, the SO current is a precharge current used to perturb the state of the free layer of the magnetic junction 192 from equilibrium, allowing faster switching. The appropriate storage cell(s) 190 are selected via word line signal(s) WLi, where i may be 0 through n. If spin transfer is to be used in writing to the cell(s) 190, a spin transfer current is driven through the magnetic junction 192 via bit line 182' and source line 184. Thus, the magnetic junctions 192 may be written using a combination of SO interaction and STT.

The subarray 170' shares the benefits of the memories 100 and 150. In particular, the use of SO torque may be used in switching the magnetic junction 192. The SO torque may be used separately or, in at least some embodiments, with STT. The spin-orbit torque switching, particularly in conjunction with STT switching, may reduce the switching time and write error rate. The subarray 170' is hierarchical in nature and thus may be easily extended to larger sizes and/or higher densities. In addition, the subarray 170' is hierarchical and modular. Thus, circuitry may be duplicated and added to build larger memories. Consequently, the subarray 170' may be usable in higher density memories.

Figure 8:
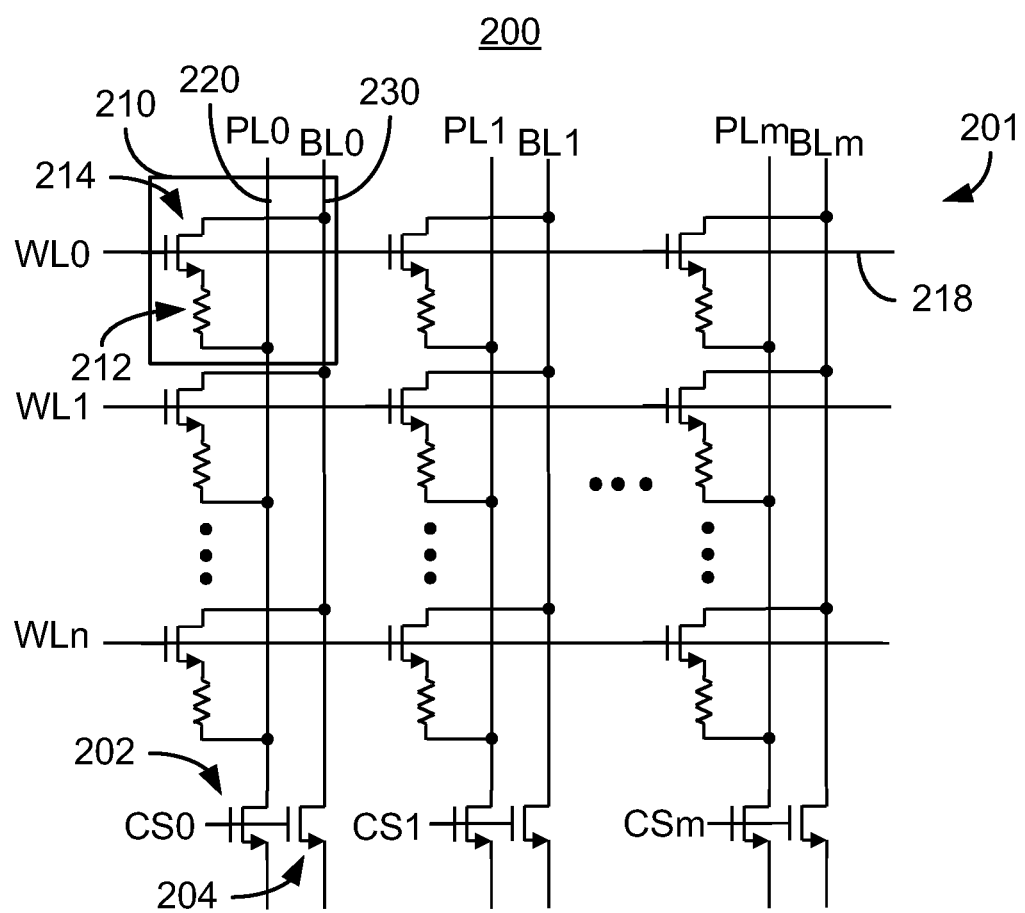
FIG. 8 depicts another exemplary embodiment of a portion of a magnetic memory employing the spin transfer effect in connection with the spin-orbit interaction for switching.

FIG. 8 depicts another exemplary embodiment of a portion of a magnetic memory 200 employing the spin transfer effect in connection with the spin-orbit interaction for switching. The memory 200 includes MAT 201. Other portions of the memory 200, such as other MATs in the subarray, intermediate circuitry and global circuitry, are not shown. The memory 200 is analogous to the memories 100 and 150. Consequently, the memory 200 includes a subarray (not shown), intermediate circuitry (not shown), intermediate bit lines (not shown), global bit lines (not shown) and global circuitry (not shown) that may be analogous to the subarray 170 and 170', intermediate circuitry 172 and 172', intermediate bit lines 174 and 174', global bit lines 162, 164, 166, 168, 166' and 168', and global circuitry 160, respectively. The memory 200 includes a MAT 201 corresponding to the MATs 180 and 180'. For clarity, only one MAT 201 is shown. The MAT 201 includes memory cells 210 including a magnetic junction 212 and selection device 214 analogous to the memory cells 102 and 190, magnetic junctions 110 and 192, and the selection devices 104 and 194, respectively. Although not shown, the MAT 201 also includes an SO active layer analogous to the SO active layer 122. The SO active layer may adjoin the free layer of the magnetic junction 212. The MAT 201 also includes common buses (precharge lines PLi where i is from 0 through m) 220 and bit lines (BLi) 230 that are analogous to common buses 182, 182' and source line 184. The common buses 220 are so termed because these lines are coupled with the magnetic junction 212. The common buses 220 thus would include, be adjacent to, and/or drive the SO active layers (not shown) that are used in writing to the magnetic junctions 192 via SO torque. The memory 200 also includes gates 202 and 204 driven by signals CSi, where i=0, 1, . . . m. Note that in the memory 200, the common buses 220 are parallel to the bit lines 230 and perpendicular to the word lines 218.

In order to write to a cell 210 selection devices 202 and 204 are selected and driven using the CSO signal. Consequently, a SO current is driven in plane through the line 220, resulting in a SO torque on the free layer of the magnetic junction 212. In some embodiments, the SO current is a precharge current used to perturb the state of the free layer of the magnetic junction 212 from equilibrium, allowing faster switching. The appropriate storage cell(s) 210 are selected via word line signal(s) WLi, where i may be 0 through n, driven through the word line 218. If spin transfer is to be used in writing to the cell(s) 210, a spin transfer current is driven through the magnetic junction(s) 212 via bit lines 230. Thus, the magnetic junctions 212 may be written using a combination of SO interaction and STT.

The memory 200 shares the benefits of the memories 100, 150 and 170'. In particular, the use of SO torque may be used in switching the magnetic junction 212. The SO torque may be used with STT or separately. The spin-orbit torque switching, particularly in conjunction with STT switching, may reduce the switching time and write error rate. The memory 200 is hierarchical in nature and thus may be easily extended to larger sizes and/or higher densities. In addition, the memory 200 is modular. Thus, circuitry may be duplicated and added to build larger memories. Consequently, the memory 200 may be usable in higher density memories.

Figure 9:
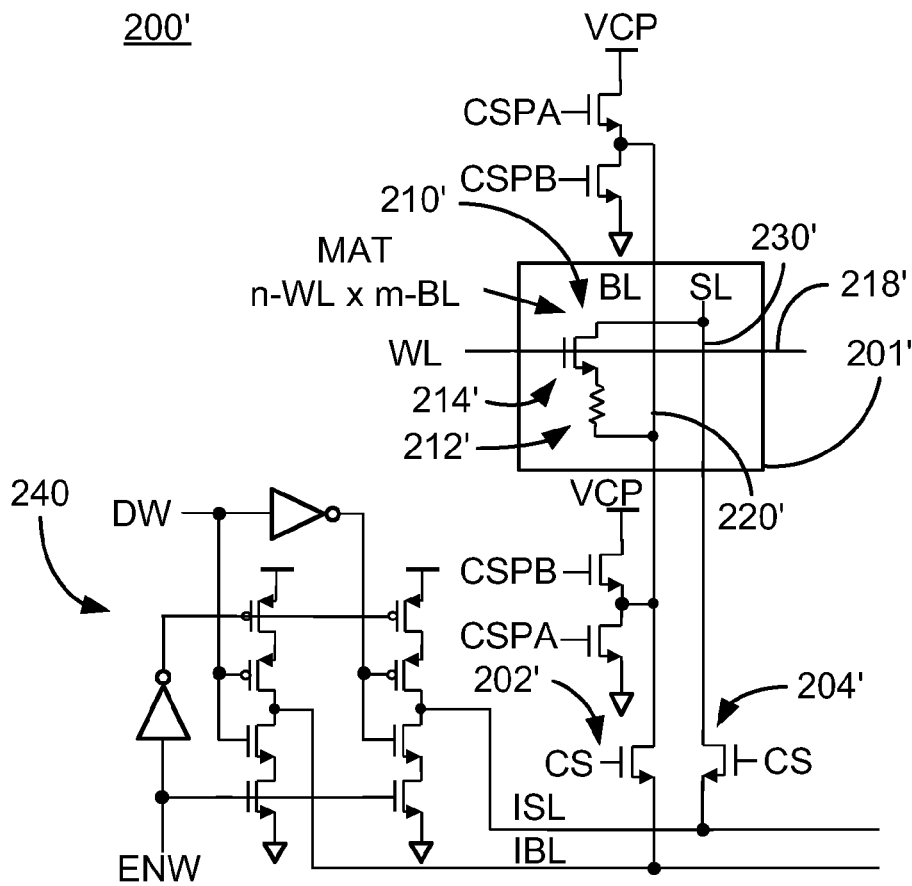
FIG. 9 depicts another exemplary embodiment of a portion of a magnetic memory employing the spin transfer effect in connection with the spin-orbit interaction for switching.
Figure 10:
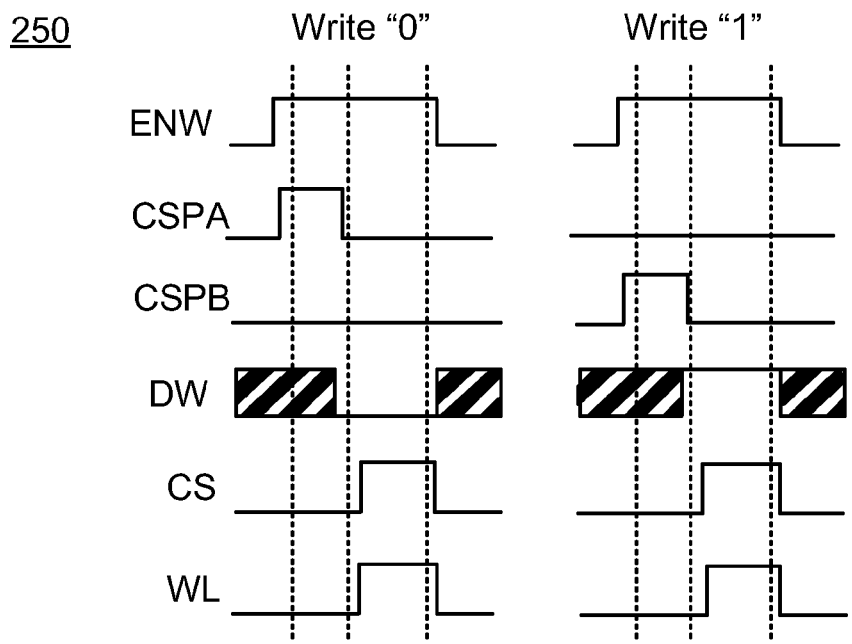
FIG. 10 depicts an exemplary embodiment of a timing diagram for an exemplary embodiment of a portion of a magnetic memory employing the spin transfer effect in connection with the spin-orbit interaction for switching.

FIG. 9 depicts another exemplary embodiment of a portion of a magnetic memory 200' employing the spin transfer effect in connection with the spin-orbit interaction for switching. FIG. 10 depicts an exemplary embodiment of a timing diagram 250 used in writing a logical 0 (Write "0") and writing a logical 1 (Write "1") for an exemplary embodiment of a portion of the magnetic memory 200'. The memory 200' is analogous to the memories 100, 150 and 200. Consequently, analogous components are similarly labeled. The memory 200' includes MAT 201' that is part of a subarray, intermediate circuitry 240, and intermediate bit lines ISL and IBL that are analogous to the MATs 180, 180' and 200, intermediate circuitry 172 and 172' and intermediate bit lines 174 and 174'. Other portions of the memory 200', such as other MATs in the subarray, and global circuitry, are not shown. Consequently, the memory 200' may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 201' is shown. The MAT 201' includes memory cells 210' including at least one magnetic junction 212' and at least one selection device 214' analogous to the memory cells 102, 190 and 210, magnetic junctions 110, 192, and 212 and the selection devices 104, 194 and 214, respectively. Although only one word line 218' and one bit line BL are labeled, the MAT is indicated as including n word lines and m bit lines (nWL× mBL). Although not shown, the MAT 201' also includes an SO active layer analogous to the SO active layer 122. The SO active layer may adjoin the free layer of the magnetic junction 212'. The MAT 201' also includes common buses (bit lines) 220 and source lines 230 that are analogous to common buses 182, 182', 220 and source line 184 and 230, respectively. The common buses 220' are so termed because these lines are coupled with the magnetic junction 212'. The common buses 220' thus would include, be adjacent to, and/or drive the SO active layers (not shown) that are used in writing to the magnetic junctions 212' via SO torque. The memory 200' also includes gates 202' and 204' driven by signals CS, where i=0, 1, . . . m. Note that in the memory 200', the common buses 220' are parallel to the source lines 230' and perpendicular to the word lines 218'.

Referring to FIGS. 9 and 10, intermediate circuitry 240' may be controlled by signals DW and ENW provided via global bit lines. Signals CSPA and CSPB are selectively enabled based on the data to be written to the cell 210'. Signals CS and WL are used to enable the common bus 220' and source line 230' for writing to the cell 210'. More specifically, the common bus 220' is enabled to drive a precharge current through the common bus 220'. As can be seen from the timing diagram 250 and memory 200', depending upon the data to be written, the current may be driven through the common bus 220' in a different direction. Thus, the precharge/SO current is a bidirectional current. This precharge current perturbs the magnetic moment of the free layer from the easy axis. The word line 218' and source line 230' are then enabled to drive the STT current through the source line 230', the magnetic junction 212' and the common bus 220'. The order in which the write current traverses the components 230', 212' and 220' depends upon the data being written. In some embodiments, this write current is driven perpendicular to plane through the magnetic junction before the magnetic moment can decay back to equilibrium. Thus, the magnetic junction 212' may be written using a combination of SO interaction and STT.

The memory 200' shares the benefits of the memories 100, 150, 170' and 200. In particular, the use of SO torque may be used in switching the magnetic junction 212'. The spin-orbit torque switching in conjunction with STT switching, may reduce the switching time and write error rate. The memory 200' is hierarchical and modular in nature. The memory 200' may thus be easily extended to larger sizes and/or higher densities. The circuitry may be duplicated and added to build larger memories. Consequently, the memory 200' may be usable in higher density memories.

Figure 11:
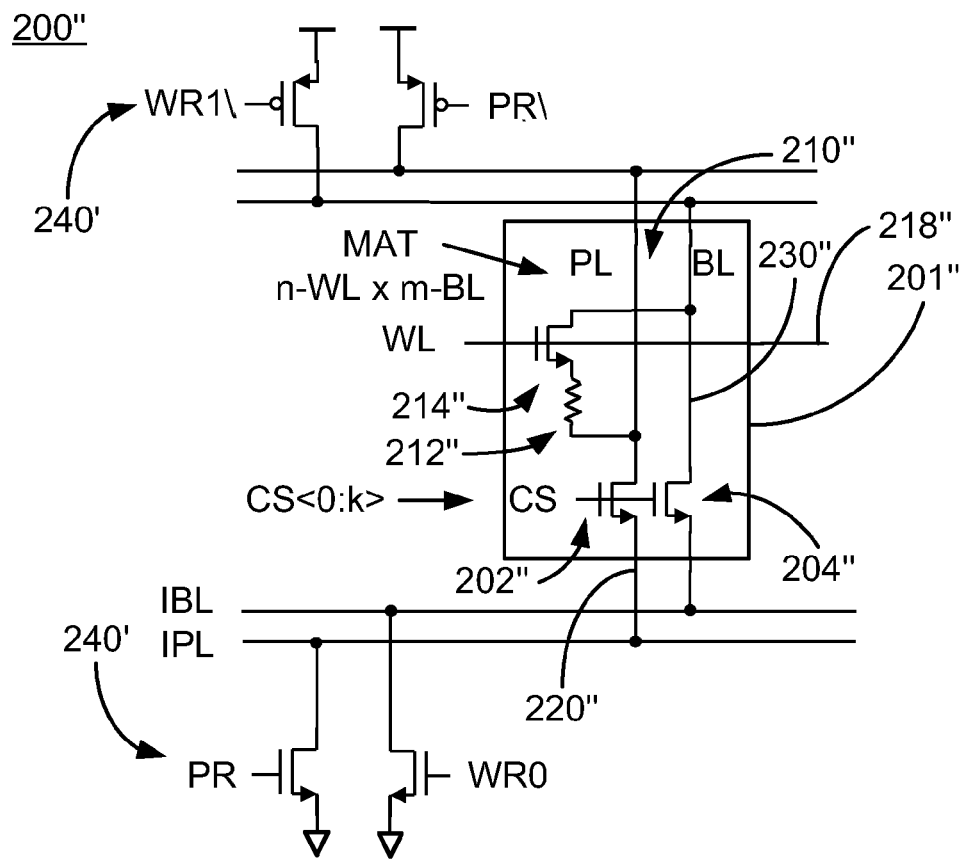
FIG. 11 depicts another exemplary embodiment of a portion of a magnetic memory employing the spin transfer effect in connection with the spin-orbit interaction for switching.
Figure 12:
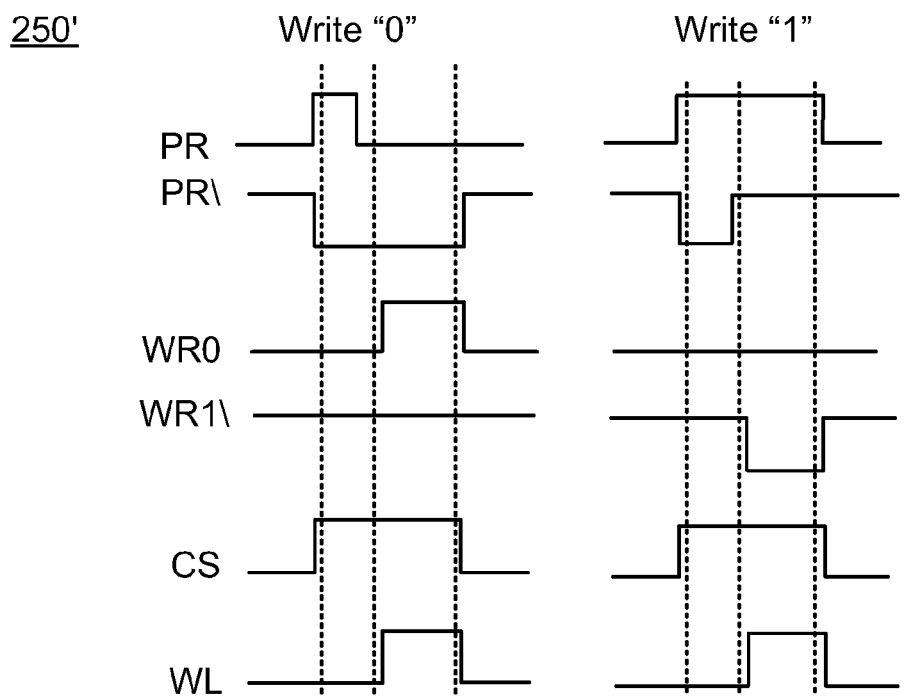
FIG. 12 depicts an exemplary embodiment of a timing diagram for an exemplary embodiment of a portion of a magnetic memory employing the spin transfer effect in connection with the spin-orbit interaction for switching.

FIG. 11 depicts another exemplary embodiment of a portion of a magnetic memory 200" employing the spin transfer effect in connection with the spin-orbit interaction for switching. FIG. 12 depicts an exemplary embodiment of a timing diagram 250' used in writing a logical 0 (Write "0") and writing a logical 1 (Write "1") for the magnetic memory 200". The memory 200" is analogous to the memories 100, 150, 200 and 200'. Consequently, analogous components are similarly labeled. The memory 200" includes MAT 201" that is part of a subarray, intermediate circuitry 240", and intermediate bit lines IPL and IBL that are analogous to the MATs 180, 180', 200 and 200', intermediate circuitry 172 and 172' and intermediate bit lines 174 and 174'. Other portions of the memory 200", such as other MATs in the subarray, and global circuitry, are not shown. Consequently, the memory 200" may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 201" is shown. The MAT 201" includes memory cells 210" including at least one magnetic junction 212" and at least one selection device 214" analogous to the memory cells 102, 190, 201 and 210', magnetic junctions 110, 192, 212 and 212' and the selection devices 104, 194, 214 and 214', respectively. Although not shown, the MAT 201" also includes an SO active layer analogous to the SO active layer 122. The SO active layer may adjoin the free layer of the magnetic junction 212". The MAT 201" also includes common buses (bit lines) 220" and source lines 230" that are analogous to common buses 182, 182', 220 and 220' and source line 184, 230 and 230', respectively. The common buses 220" are so termed because these lines are coupled with the magnetic junction 212". The common buses 220" thus would include, be adjacent to, and/or drive the SO active layers (not shown) that are used in writing to the magnetic junctions 212" via SO torque. The memory 200" also includes gates 202" and 204" driven by signals CS (also indicated as an input CS<0:k> in FIG. 11). Note that in the memory 200", the common buses 220" are parallel to the bit lines 230" and perpendicular to the word lines 218".

Referring to FIGS. 11 and 12, intermediate circuitry 240" may be controlled by signals PR, PR\, WR0, WR1\ provided by write control logic. Signal CS is used to enable the Intermediate bit-lines (IBL) 220" and intermediate source-line (ISL) 230" for writing to the cell 210". More specifically, the common bus PL 220" is enabled to drive a precharge current through the common bus 220". As can be seen from the timing diagram 250' and memory 200", the current may be driven through the common bus, PL 220' in the same direction regardless of the data being written. Thus, the precharge/SO current is a unidirectional current. This precharge current perturbs the magnetic moment of the free layer from the easy axis. The word line 218" and bit line 230" are then enabled to drive the STT current through the bit line 230", the magnetic junction 212" and through the common bus 220". The order in which the STT current traverses the components 230", 212" and 220" depends upon the data being written. In some embodiments, this write current is driven perpendicular to plane through the magnetic junction before the magnetic moment can decay back to equilibrium. Thus, the magnetic junction 212" may be written using a combination of SO interaction and STT.

The memory 200" shares the benefits of the memories 100, 150, 170', 200 and 200'. In particular, the use of SO torque may be used in switching the magnetic junction 212". The spin-orbit torque switching in conjunction with STT switching, may reduce the switching time and write error rate. The memory 200" is hierarchical and modular in nature. The memory 200" may thus be easily extended to larger sizes and/or higher densities. The circuitry may be duplicated and added to build larger memories. Consequently, the memory 200" may be usable in higher density memories.

Figure 13:
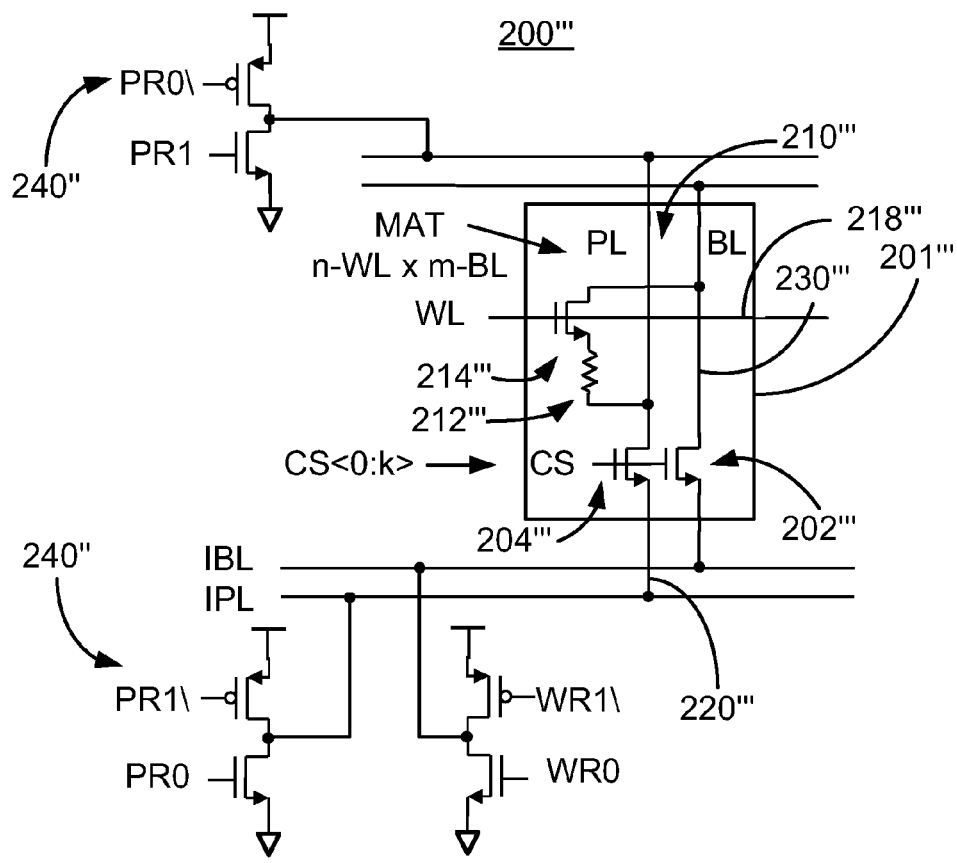
FIG. 13 depicts another exemplary embodiment of a portion of a magnetic memory employing the spin transfer effect in connection with the spin-orbit interaction for switching.
Figure 14:
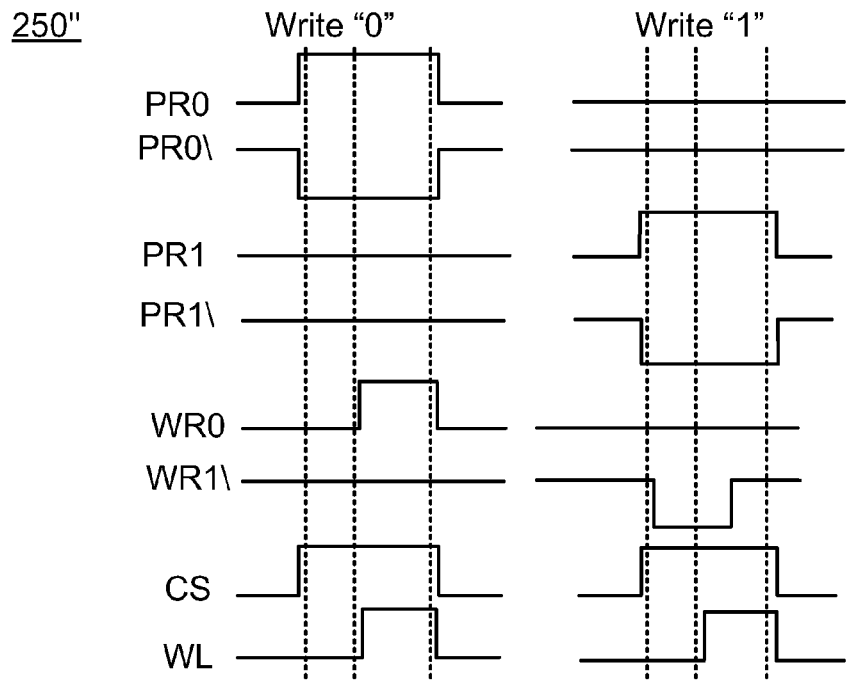
FIG. 14 depicts an exemplary embodiment of a timing diagram for an exemplary embodiment of a portion of a magnetic memory employing the spin transfer effect in connection with the spin-orbit interaction for switching.

FIG. 13 depicts another exemplary embodiment of a portion of a magnetic memory 200''' employing the spin transfer effect in connection with the spin-orbit interaction for switching. FIG. 14 depicts an exemplary embodiment of a timing diagram 250" used in writing a logical 0 (Write "0") and writing a logical 1 (Write "1") for the magnetic memory 200'''. The memory 200''' is analogous to the memories 100, 150, 200, 200' and 200". Consequently, analogous components are similarly labeled. The memory 200''' includes MAT 201''' that is part of a subarray, intermediate circuitry 240", and intermediate bit lines IPL and IBL that are analogous to the MATs 180, 180', 200, 200' and 200", intermediate circuitry 172 and 172', 240 and 240' and intermediate bit lines 174, 174'. Other portions of the memory 200''', such as other MATs in the subarray, and global circuitry, are not shown. Consequently, the memory 200" may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 201''' is shown. The MAT 201''' includes memory cells 210''' including at least one magnetic junction 212''' and at least one selection device 214''' analogous to the memory cells 102, 190, 210, 210' and 210", magnetic junctions 110, 192, 212, 212' and 212" and the selection devices 104, 194, 214, 214' and 214", respectively. Although not shown, the MAT 201''' also includes an SO active layer analogous to the SO active layer 122. The SO active layer may adjoin the free layer of the magnetic junction 212". The MAT 201''' also includes common buses (PL) 210''' and bit lines (BL) 230''' that are analogous to common buses 182, 182', 220, 220' and 220" and lines 184, 230, 230' and 230", respectively. (IPL is 220''') The common buses 210''' are so termed because these lines are coupled with the magnetic junction 212'''. The common buses 210''' thus would include, be adjacent to, and/or drive the SO active layers (not shown) that are used in writing to the magnetic junctions 212''' via SO torque. The memory 200''' also includes gates 202''' and 204''' driven by signals CS (also indicated as an input CS<0:k>). Note that in the memory 200''', the common buses 220''' are parallel to the bit lines 230''' and perpendicular to the word lines 218'''.

Referring to FIGS. 13 and 14, intermediate circuitry 240" may be controlled by signals PR0, PR0\, PR1, PR1\, WR0 and WR1\ provided by write control logic. Signal CS is used to enable the common bus 220''' and bit line 230''' for writing to the cell 210". More specifically, the common bus 220''' is enabled to drive a precharge current through the common bus 220'''. As can be seen from the timing diagram 250'' and memory 200''', the current may be driven through the common bus 220' in a direction that depends upon the data being written. Thus, the precharge/SO current is a bidirectional current. This precharge current perturbs the magnetic moment of the free layer from the easy axis. The word line 218'' is then enabled to allow an STT current to be driven through the bit line 230''', the magnetic junction 212''' and through the common bus 220''' or vice versa. The order in which the STT current traverses the components 230''', 212''' and 220''' depends upon the data being written. In some embodiments, this write current is driven perpendicular to plane through the magnetic junction before the magnetic moment can decay back to equilibrium. Thus, the magnetic junction 212''' may be written using a combination of SO interaction and STT.

The memory 200''' shares the benefits of the memories 100, 150, 170', 200, 200' and 200''. In particular, the use of SO torque may be used in switching the magnetic junction 212'''. The spin-orbit torque switching in conjunction with STT switching, may reduce the switching time and write error rate. The memory 200''' is hierarchical and modular in nature. The memory 200''' may thus be easily extended to larger sizes and/or higher densities. The circuitry may be duplicated and added to build larger memories. Consequently, the memory 200''' may be usable in higher density memories.

Figure 15:
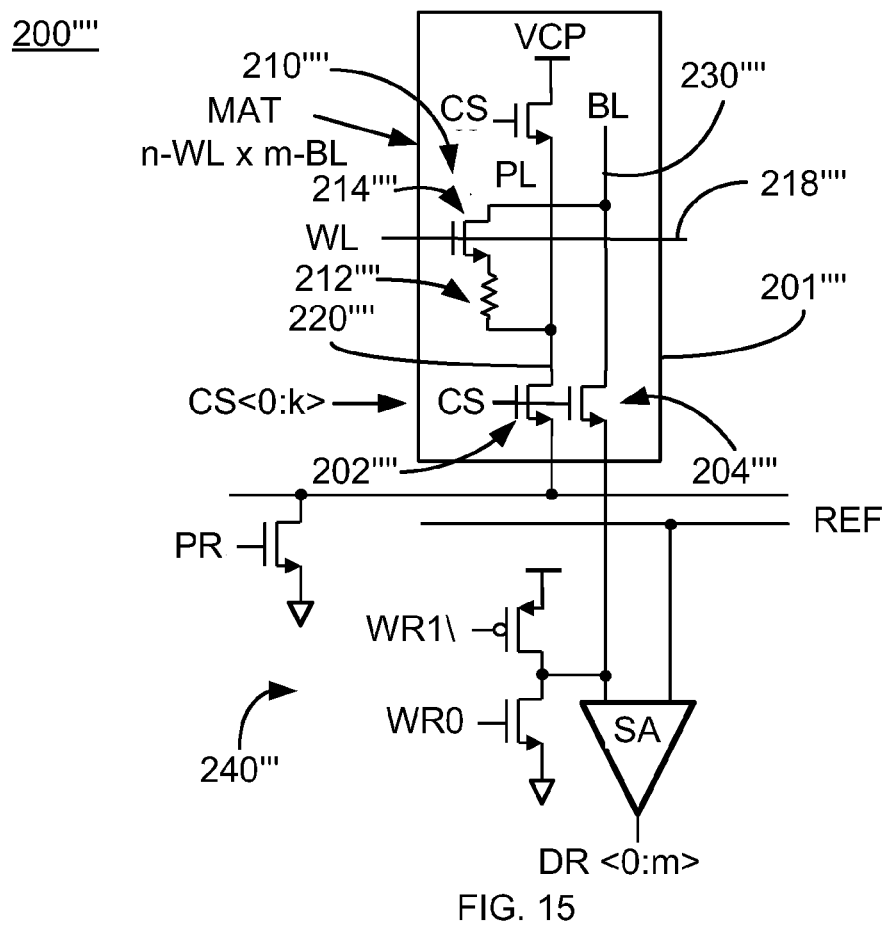
FIG. 15 depicts another exemplary embodiment of a portion of a magnetic memory employing the spin transfer effect in connection with the spin-orbit interaction for switching.
Figure 16:
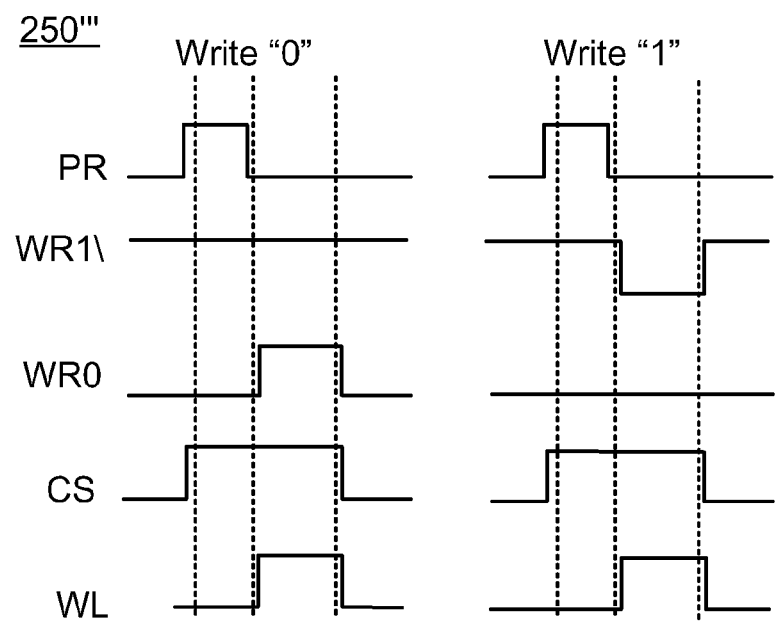
FIG. 16 depicts an exemplary embodiment of a timing diagram for an exemplary embodiment of a portion of a magnetic memory employing the spin transfer effect in connection with the spin-orbit interaction for switching.

FIG. 15 depicts another exemplary embodiment of a portion of a magnetic memory 200'''' employing the spin transfer effect in connection with the spin-orbit interaction for switching. FIG. 16 depicts an exemplary embodiment of a timing diagram 250''' used in writing a logical 0 (Write "0") and writing a logical 1 (Write "1") for the magnetic memory 200''''. The memory 200'''' is analogous to the memories 100, 150, 200, 200', 200'' and 200'''. Consequently, analogous components are similarly labeled. The memory 200'''' includes MAT 201'''' that is part of a subarray, intermediate circuitry 240''', and intermediate bit lines that are analogous to the MATs 180, 180', 200, 200', 200'' and 200''', intermediate circuitry 172 and 172', 240, 240', 240'' and 240''' and intermediate bit lines 174, 174'. Other portions of the memory 200'''', such as other MATs in the subarray, and global circuitry, are not shown. Consequently, the memory 200'''' may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 201'''' is shown. Although only one word line 218'''' and one bit line BL 230'''' are labeled, the MAT is indicated as including n word lines and m bit lines (nWL×mBL). The MAT 201'''' includes memory cells 210'''' including at least one magnetic junction 212'''' and at least one selection device 214'''' analogous to the memory cells 102, 190, 210, 210', 210'' and 210''', magnetic junctions 110, 192, 212, 212', 212'' and 212''' and the selection devices 104, 194, 214, 214', 214'' and 214''', respectively. Although not shown, the MAT 201'''' also includes an SO active layer analogous to the SO active layer 122. The SO active layer may adjoin the free layer of the magnetic junction 212''''. The MAT 201'''' also includes common buses (PL) 220'''' and bit lines 230'''' that are analogous to common buses 182, 182', 220, 220', 220'' and 220''' and lines 184, 230, 230', 230'' and 230''', respectively. The common buses 220'''' are so termed because these lines are coupled with the magnetic junction 212''''. The common buses 220'''' thus would include, be adjacent to, and/or drive the SO active layers (not shown) that are used in writing to the magnetic junctions 212'''' via SO torque. The memory 200'''' also includes gates 202'''' and 204'''' driven by signals CS (also indicated as an input CS<0:k>). Also shown is sense amplifier (SA) which may output the read data (DR<=0:m>). Note that in the memory 200'''', the common buses 220'''' are parallel to the bit lines 230'''' and perpendicular to the word lines 218'''. The intermediate circuitry 240''' also includes a local sense amplifier SA and write driver circuitry. In other embodiments, the sense amplifier and/or write driver circuitry may be included in global circuitry (not shown in FIG. 15).

Referring to FIGS. 15 and 16, intermediate circuitry 240'''' may be controlled by signals PR, WR0 and WR1\ provided by write control logic. In the embodiment shown, VCP is half way between ground and the supply voltage. Signal CS is used to enable the selected common bus 220'''' and bit line 230'''' for writing to the cell 210''''. The common bus 220'''' is enabled to drive a precharge current through the common bus 220''''. As can be seen from the timing diagram 250''' and memory 200'''', the current may be driven through the common bus 220'''' in the same direction regardless of the data being written. Thus, the precharge/SO current is a unidirectional current. However, in other embodiments, portions of the memory 200'''' may be changed to CMOS for a bidirectional precharge current. This precharge current perturbs the magnetic moment of the free layer from the easy axis. The word line 218'''' and bit line 230'''' are then enabled to drive the STT current through the bit line 230'''', the magnetic junction 212'''' and through the common bus 220''''. The order in which the STT current traverses the components 230'''', 212'''' and 220'''' depends upon the data being written and the signals WR0 and WR1\. In some embodiments, this write current is driven perpendicular to plane through the magnetic junction before the magnetic moment can decay back to equilibrium. Thus, the magnetic junction 212'''' may be written using a combination of SO interaction and STT.

The memory 200'''' shares the benefits of the memories 100, 150, 170', 200, 200' and 200''. In particular, the use of SO torque may be used in switching the magnetic junction 212''''. The spin-orbit torque switching in conjunction with STT switching, may reduce the switching time and write error rate. The memory 200'''' is hierarchical and modular in nature. The memory 200'''' may thus be easily extended to larger sizes and/or higher densities. The circuitry may be duplicated and added to build larger memories. Consequently, the memory 200'''' may be usable in higher density memories.

Figure 17:
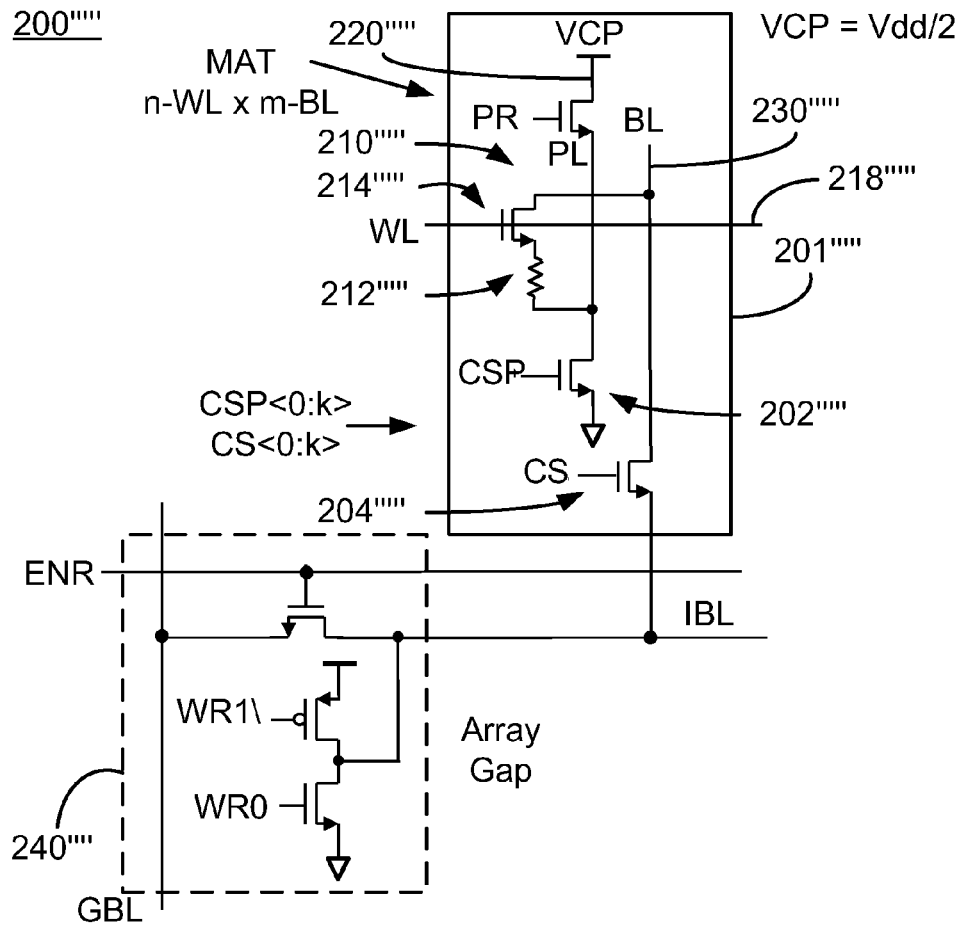
FIG. 17 depicts another exemplary embodiment of a portion of a magnetic memory employing the spin transfer effect in connection with the spin-orbit interaction for switching.
Figure 18:
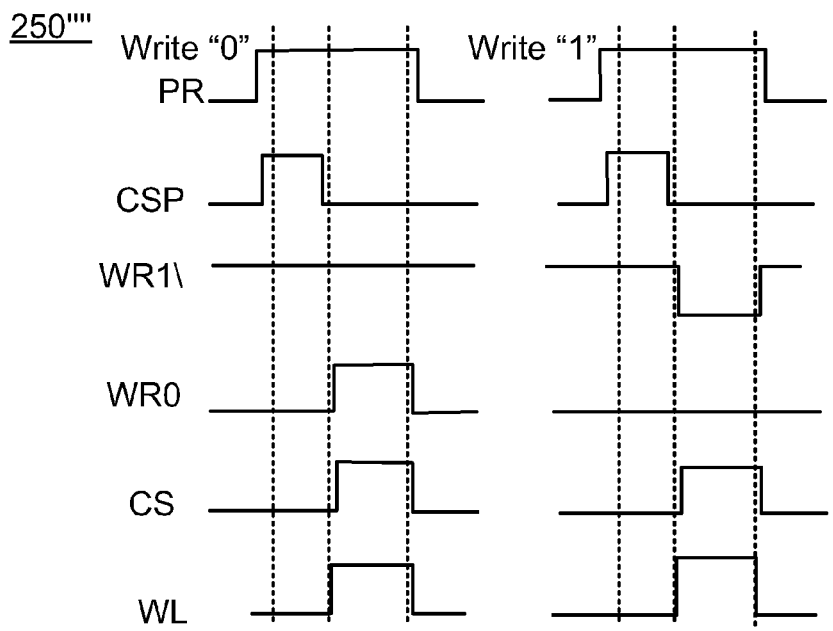
FIG. 18 depicts an exemplary embodiment of a timing diagram for an exemplary embodiment of a portion of a magnetic memory employing the spin transfer effect in connection with the spin-orbit interaction for switching.

FIG. 17 depicts another exemplary embodiment of a portion of a magnetic memory 200''''' employing the spin transfer effect in connection with the spin-orbit interaction for switching. FIG. 18 depicts an exemplary embodiment of a timing diagram 250'''' used in writing a logical 0 (Write "0") and writing a logical 1 (Write "1") for the magnetic memory 200'''''. The memory 200''''' is analogous to the memories 100, 150, 200, 200', 200'', 200''' and 200''''. Consequently, analogous components are similarly labeled. The memory 200''''' includes MAT 201''''' that is part of a subarray, intermediate circuitry 240'''', and intermediate bit lines that are analogous to the MATs 180, 180', 200, 200', 200'', 200''' and 200'''', intermediate circuitry 172 and 172', 240, 240', 240'', 240''' and 240'''' and intermediate bit lines 174 and 174'. Other portions of the memory 200''''', such as other MATs in the subarray, and global circuitry, are not shown. Consequently, the memory 200''''' may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 201''''' is shown. Although only one word line 218''''' and one bit line BL 230''''' are labeled, the MAT is indicated as including n word lines and m bit lines (nWL×mBL). The MAT 201'''''' includes memory cells 210'''''' including at least one magnetic junction 212'''''' and at least one selection device 214'''''' analogous to the memory cells 102, 190, 210, 210', 210'', 210''', 210'''' and 210''''', magnetic junctions 110, 192, 212, 212', 212'', 212''', 212'''' and 212''''' and the selection devices 104, 194, 214, 214', 214'', 214''', 214'''' and 214''''', respectively. Although not shown, the MAT 201'''''' also includes an SO active layer analogous to the SO active layer 122. The SO active layer may adjoin the free layer of the magnetic junction 212''''''. The MAT 201'''''' also includes common buses (source lines) 220'''''' and bit lines 230'''''' that are analogous to common buses 182, 182', 220, 220', 220'', 220''', 220'''' and 220''''' and lines 184, 230, 230', 230'', 230''', 230'''' and 230''''', respectively. Also shown is high voltage VCP, which may be half the supply voltage (Vdd/2). The common buses 220'''''' are so termed because these lines are coupled with the magnetic junction 212''''''. The common buses 220'''''' thus would include, be adjacent to, and/or drive the SO active layers (not shown) that are used in writing to the magnetic junctions 212'''''' via SO torque. The memory 200'''''' also includes gates 202'''''' and 204'''''' driven by signals CSP and CS (also denoted by inputs CSP<0:k> and CS<0:k>). Note that in the memory 200'''''', the common buses 220'''''' are parallel to the bit lines 230'''''' and perpendicular to the word lines 218''''''.

Referring to FIGS. 17 and 18, intermediate circuitry 240'''''' may be connected to global line GBL and controlled by signals WR0 and WR1\ that may be provided write control logic. Signal CS is used to enable the selected common bus 220'''''' and bit line 230'''''' for writing to the cell 210''''''. The common bus 220'''''' is enabled to drive a precharge current through the common bus 220''''''. As can be seen from the timing diagram 250'''' and memory 200'''''', the current may be driven through the common bus 220'''''' in the same direction regardless of the data being written. Thus, the precharge/SO current is a unidirectional current. This precharge current perturbs the magnetic moment of the free layer from the easy axis. The word line 218'''''' and bit line 230'''''' are then enabled to drive the STT current through the bit line 230'''''', the magnetic junction 212'''''' and through the common bus 220''''''. The order in which the STT current traverses the components 230'''''', 212'''''' and 220'''''' depends upon the data being written and the signals WR0 and WR1\. In some embodiments, this write current is driven perpendicular to plane through the magnetic junction before the magnetic moment can decay back to equilibrium. Thus, the magnetic junction 212'''''' may be written using a combination of SO interaction and STT.

The memory 200'''''' shares the benefits of the memories 100, 150, 170', 200, 200', 200'', 200''' and 200''''. In particular, the use of SO torque may be used in switching the magnetic junction 212''''''. The spin-orbit torque switching in conjunction with STT switching, may reduce the switching time and write error rate. The memory 200'''''' is hierarchical and modular in nature. The memory 200'''''' may thus be easily extended to larger sizes and/or higher densities. The circuitry may be duplicated and added to build larger memories. Consequently, the memory 200'''''' may be usable in higher density memories.

Figure 19:
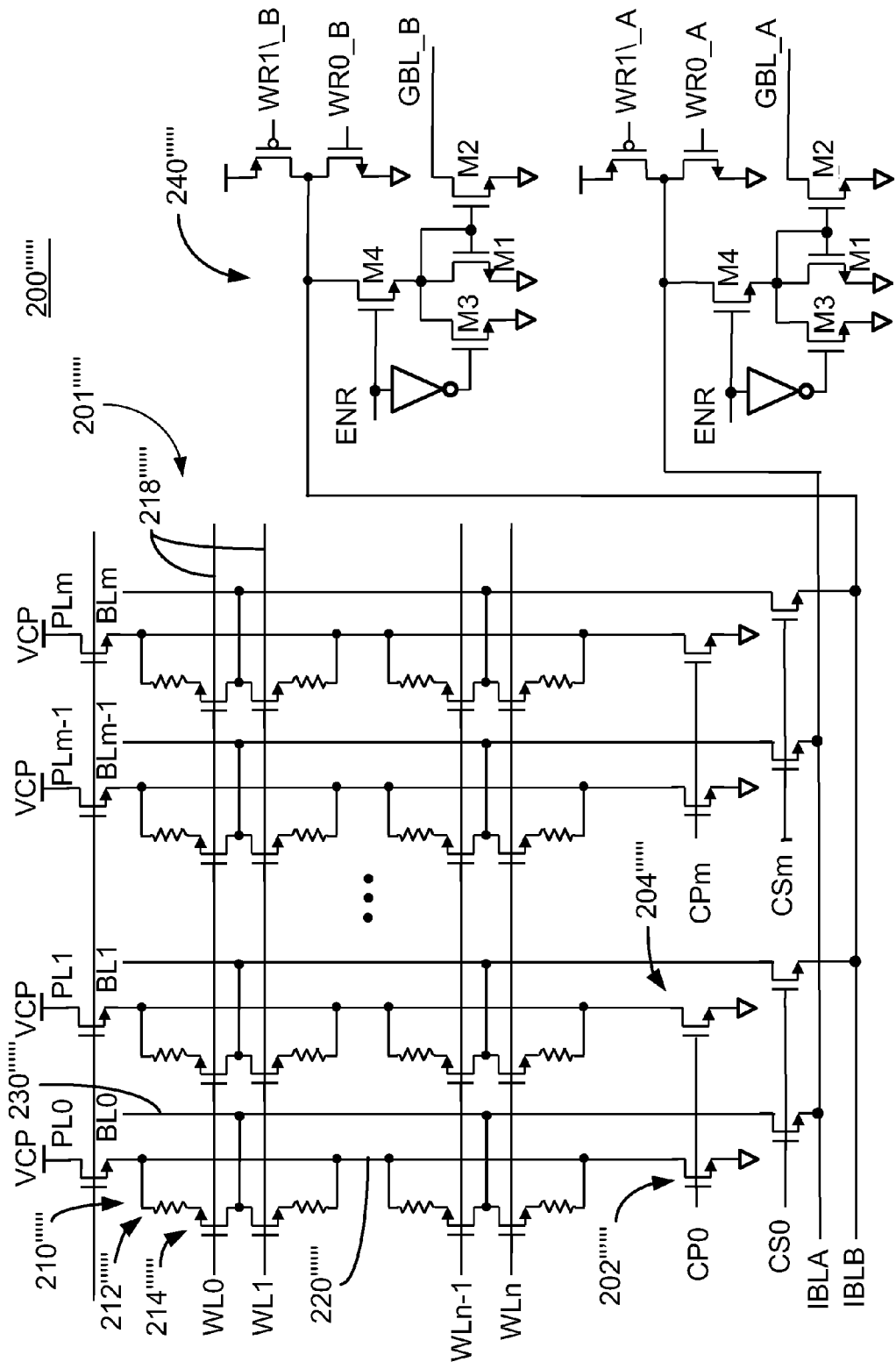
FIG. 19 depicts another exemplary embodiment of a portion of a magnetic memory employing the spin transfer effect in connection with the spin-orbit interaction for switching.

FIG. 19 depicts another exemplary embodiment of a portion of a magnetic memory 200''''''' employing the spin transfer effect in connection with the spin-orbit interaction for switching. The memory 200''''''' is analogous to the memories 100, 150, 200, 200', 200'', 200''', 200'''' and 200'''''. Consequently, analogous components are similarly labeled. The memory 200''''''' includes MAT 201''''''' that is part of a subarray, intermediate circuitry 240''''''', and intermediate bit lines that are analogous to the MATs 180, 180', 200, 200', 200'', 200''', 200'''', 200''''' and 200'''''', intermediate circuitry 172 and 172', 240, 240', 240'', 240''' and 240'''' and intermediate bit lines 174 and 174'. Other portions of the memory 200''''''', such as other MATs in the subarray, and global circuitry, are not shown. Consequently, the memory 200''''''' may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 201''''''' is shown. The MAT 201''''''' includes memory cells 210''''''' including at least one magnetic junction 212''''''' and at least one selection device 214''''''' analogous to the memory cells 102, 190, 210, 210', 210'', 210''', 210'''' and 210''''', magnetic junctions 110, 192, 212, 212', 212'', 212''', 212'''' and 212''''' and the selection devices 104, 194, 214, 214', 214''', 214''', 214'''' and 214''''', respectively. Although not shown, the MAT 201''''''' also includes an SO active layer analogous to the SO active layer 122. The SO active layer may adjoin the free layer of the magnetic junction 212'''''''. The MAT 201''''''' also includes common buses (PLi, where i is from 0 to m) 220''''''' and bit lines 230''''''' that are analogous to common buses 182, 182', 220, 220', 220'', 220''', 220'''' and 220''''' and lines 184, 230, 230', 230'', 230''', 230'''' and 230''''', respectively. The common buses 220''''''' are so termed because these lines are coupled with the magnetic junction 212'''''''. The common buses 220''''''' thus would include, be adjacent to, and/or drive the SO active layers (not shown) that are used in writing to the magnetic junctions 212''''''' via SO torque. The memory 200''''''' also includes gates 202''''''' and 204''''''' driven by signals CS. Note that in the memory 200''''''', the common buses 220''''''' are parallel to the bit lines 230''''''' and perpendicular to the word lines 218'''''''.

In addition, the intermediate circuitry 240''''''' includes a current mirror sense scheme driven by a read enable (ENR) signal and using transistors M1, M2, M3 and M4. Each section of the current mirror takes as inputs signals WR1\_B, WR0_B and GBL_B and signals WR1\_A, WR0_A and GBL_A, respectively. Signal CS is used to enable the selected common bus 220''''''' and bit line 230''''''' for writing to the cell 210'''''''. Note that multiple memory cells 210''''''' may be simultaneously written in the memory 200'''''''. The common bus 220''''''' is enabled to drive a precharge current through the common bus 220'''''''. This precharge current perturbs the magnetic moment of the free layer from the easy axis. The word line 218''''''' and bit line 230''''''' are then enabled to drive the STT current through the bit line 230''''''', the magnetic junction 212''''''' and through the common bus 220'''''''. The order in which the STT current traverses the components 230''''''', 212''''''' and 220''''''' depends upon the data being written. In some embodiments, this write current is driven perpendicular to plane through the magnetic junction before the magnetic moment can decay back to equilibrium. Thus, the magnetic junction 212''''''' may be written using a combination of SO interaction and STT.

The memory 200''''''' shares the benefits of the memories 100, 150, 170', 200, 200', 200'', 200''', 200'''' and 200'''''. In particular, the use of SO torque may be used in switching the magnetic junction 212'''''''. The spin-orbit torque switching in conjunction with STT switching, may reduce the switching time and write error rate. The memory 200''''''' is hierarchical and modular in nature. The memory 200''''''' may thus be easily extended to larger sizes and/or higher densities. The circuitry may be duplicated and added to build larger memories. Consequently, the memory 200''''''' may be usable in higher density memories.

Figure 20:
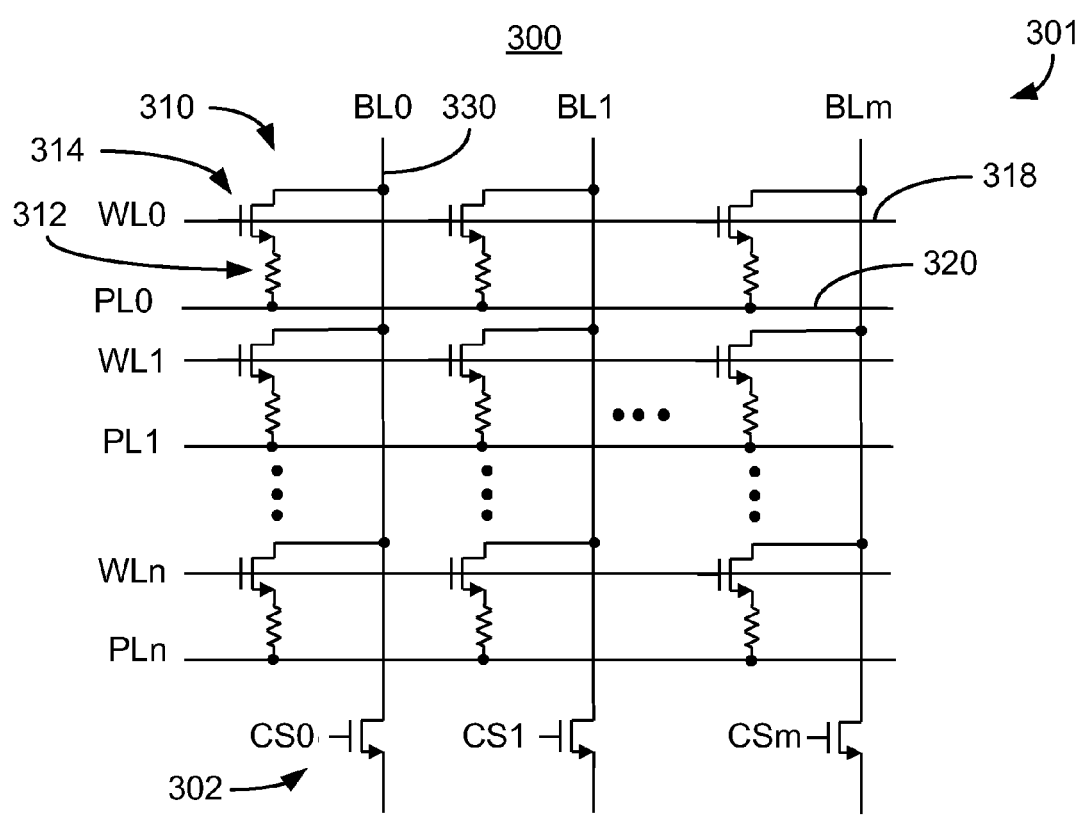
FIG. 20 depicts another exemplary embodiment of a portion of a magnetic memory employing the spin transfer effect in connection with the spin-orbit interaction for switching.

FIG. 20 depicts another exemplary embodiment of a portion of a magnetic memory 300 employing the spin transfer effect in connection with the spin-orbit interaction for switching. The memory 300 includes MAT 301. Other portions of the memory 300, such as other MATs in the subarray, intermediate circuitry and global circuitry, are not shown. The memory 300 is analogous to the memories 100, 150, 200, 200', 200'', 200''', 200'''', 200''''' and 200''''''. Consequently, the memory 300 includes a subarray (not shown), intermediate circuitry (not shown), intermediate bit lines (not shown), global bit lines (not shown) and global circuitry (not shown) that may be analogous to the subarray 170 and 170', intermediate circuitry 172 and 172', intermediate bit lines 174 and 174', global bit lines 162, 164, 166, 168, 166' and 168', and global circuitry 160, respectively. The memory 300 includes a MAT 301 corresponding to the MATs 180 and 180'. For clarity, only one MAT 301 is shown. The MAT 301 includes memory cells 310 including a magnetic junction 312 and selection device 314 analogous to the memory cells 102, 190 and 210, magnetic junctions 110, 192 and 212, and the selection devices 104, 194 and 204, respectively. Although not shown, the MAT 301 also includes an SO active layer analogous to the SO active layer 122. The SO active layer may adjoin the free layer of the magnetic junction 312. The MAT 301 also includes common buses (precharge lines PL) 320 and bit lines 330 that are analogous to common buses 182, 182', 220 and source/bit line 184 and 230. The common buses 320 are so termed because these lines are coupled with the magnetic junction 312. The common buses 320 thus would include, be adjacent to, and/or drive the SO active layers (not shown) that are used in writing to the magnetic junctions 312 via SO torque. The memory 300 also includes gates 302 and 304 driven by signals CSi, where i=0, 1, . . . m. Note that in the memory 300, the common buses 320 are perpendicular to the bit lines 330 and parallel to the word lines 318.

In order to write to a cell 310 a current is driven using the PL signal. Consequently, a SO current is driven in plane through the line 320, resulting in a SO torque on the free layer of the magnetic junction 312. In some embodiments, the SO current is a precharge current used to perturb the state of the free layer of the magnetic junction 312 from equilibrium, allowing faster switching. As can be seen in FIG. 20, magnetic cells 310 along the entire row may be preconditioned by the common bus 320. The appropriate storage cell(s) 310 are selected via word line signal(s) WLi driven through the word line(s) 318 and CSj used to select the appropriate selection device(s) 302 for the bit line(s) 330 where i may be 0 through n and j may be 1 through m. If spin transfer is to be used in writing to the cell(s) 310, a spin transfer current is driven through the magnetic junction(s) 312 via bit lines 330. Thus, the magnetic junctions 312 may be written using a combination of SO interaction and STT. Further, the memory cells 310 along a row may be written by enabling the bit lines 330.

The memory 300 shares the benefits of the memories 100, 150, 170' and 200s. In particular, the use of SO torque may be used in switching the magnetic junction 312. The SO torque may be used with STT or separately. The spin-orbit torque switching, particularly in conjunction with STT switching, may reduce the switching time and write error rate. The memory 300 is hierarchical in nature and thus may be easily extended to larger sizes and/or higher densities. In addition, the memory 300 is modular. Thus, circuitry may be duplicated and added to build larger memories. Consequently, the memory 300 may be usable in higher density memories. Further, a whole row may be written in a pass. As a result, read disturb for the memory 300 may be avoided.

Figure 21:
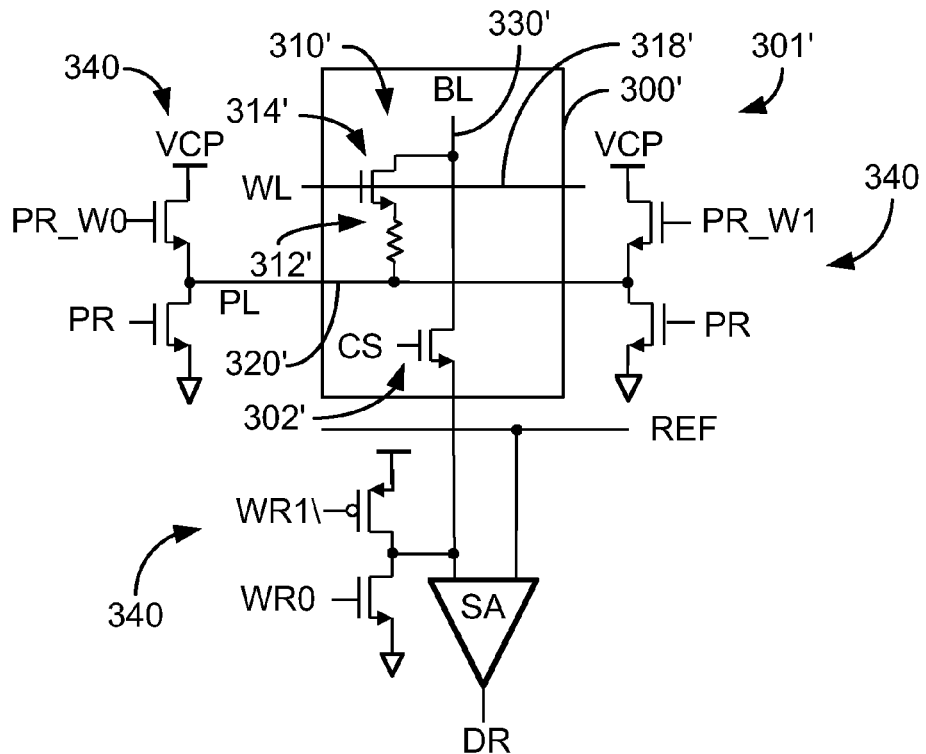
FIG. 21 depicts another exemplary embodiment of a portion of a magnetic memory employing the spin transfer effect in connection with the spin-orbit interaction for switching.
Figure 22:
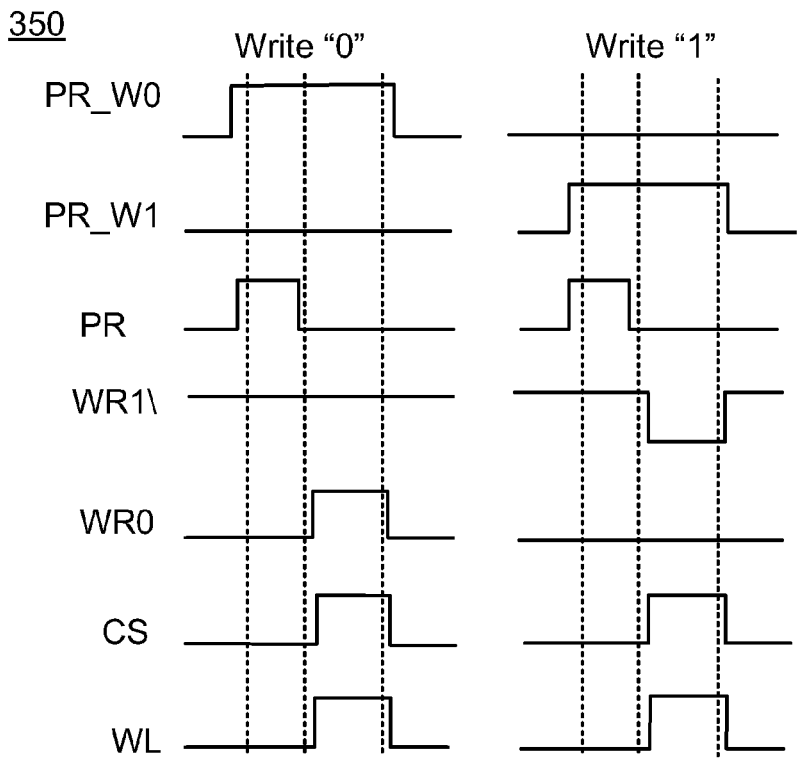
FIG. 22 depicts an exemplary embodiment of a timing diagram for an exemplary embodiment of a portion of a magnetic memory employing the spin transfer effect in connection with the spin-orbit interaction for switching.

FIG. 21 depicts another exemplary embodiment of a portion of a magnetic memory 300' employing the spin transfer effect in connection with the spin-orbit interaction for switching. FIG. 22 depicts an exemplary embodiment of a timing diagram 350 used in writing a logical 0 (Write "0") and writing a logical 1 (Write "1") for an exemplary embodiment of a portion of the magnetic memory 300'. The memory 300' is analogous to the memories 100, 150, 200s and 300. Consequently, analogous components are similarly labeled. The memory 300' includes MAT 301' that is part of a subarray, intermediate circuitry 340, and intermediate bit lines REF that are analogous to the MATs 180, 180', 201s and 301, intermediate circuitry 172, 172', 240s and intermediate bit lines 174 and 174'. Also shown is sense amplifier SA that outputs read data DR. Other portions of the memory 300', such as other MATs in the subarray, and global circuitry, are not shown. Consequently, the memory 300' may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 301' is shown. The MAT 301' includes memory cells 310' including at least one magnetic junction 312' and at least one selection device 314' analogous to the memory cells 102, 190, 210s and 310, magnetic junctions 110, 192,212 and 312 and the selection devices 104, 194, 214s and 314, respectively. Although not shown, the MAT 301' also includes an SO active layer analogous to the SO active layer 122. The SO active layer may adjoin the free layer of the magnetic junction 312'. The MAT 301' also includes common buses (PLi, where i is from 0 through n) 320' and bit lines 330 that are analogous to common buses 182, 182', 220s and 320 and bit/source line 184, 230s and 330, respectively. The common buses 320' are so termed because these lines are coupled with the magnetic junction 312'. The common buses 320' thus would include, be adjacent to, and/or drive the SO active layers (not shown) that are used in writing to the magnetic junctions 312' via SO torque. The memory 300' also includes gates 302' driven by signals CS. Note that in the memory 300', the common buses 320' are perpendicular to the bit lines 330' and parallel to the word lines 318'.

Referring to FIGS. 21 and 22, intermediate circuitry 340 may be controlled by signals provided via global bit lines (not shown). Three labels 340 are shown in FIG. 21 because these components are part of the same intermediate circuitry 340 despite being separated in the drawing for clarity. Further local sense amplifier SA may be used to read data. Signals PR-W0 and PR-W1 are used to enable the common bus 320'. Signal CS enables the bit line 330' for writing to the cell 310'. More specifically, the common bus 320' is enabled to drive a precharge current through the common bus 320'. As can be seen from the signals PR-W0 and PR-W1 and the connections between VCP, ground, and the common bus 320', the current may be driven through the common bus 320' in different directions based on the date being written. Thus, the precharge/SO current is a bidirectional current. This precharge current perturbs the magnetic moment of the free layer from the easy axis. The word line 318' and bit line 330' are then enabled to drive the STT current through the bit line 330', the magnetic junction 312' and the common bus 320'. The order in which the write current traverses the components 330', 312' and 320' depends upon the data being written. In some embodiments, this write current is driven perpendicular to plane through the magnetic junction before the magnetic moment can decay back to equilibrium. Thus, the magnetic junction 312' may be written using a combination of SO interaction and STT. Further, the memory cells 310' along a row may be written by cycling through the columns/enabling the bit lines 330'.

The memory 300' shares the benefits of the memories 100, 150, 170', 200s and 300. In particular, the use of SO torque may be used in switching the magnetic junction 312'. The spin-orbit torque switching in conjunction with STT switching, may reduce the switching time and write error rate. The memory 300' is hierarchical and modular in nature. The memory 300' may thus be easily extended to larger sizes and/or higher densities. The circuitry may be duplicated and added to build larger memories. Consequently, the memory 300' may be usable in higher density memories. Further, a whole row may be written in a pass. As a result, read disturb for the memory 300' may be reduced or avoided.

Figure 23:
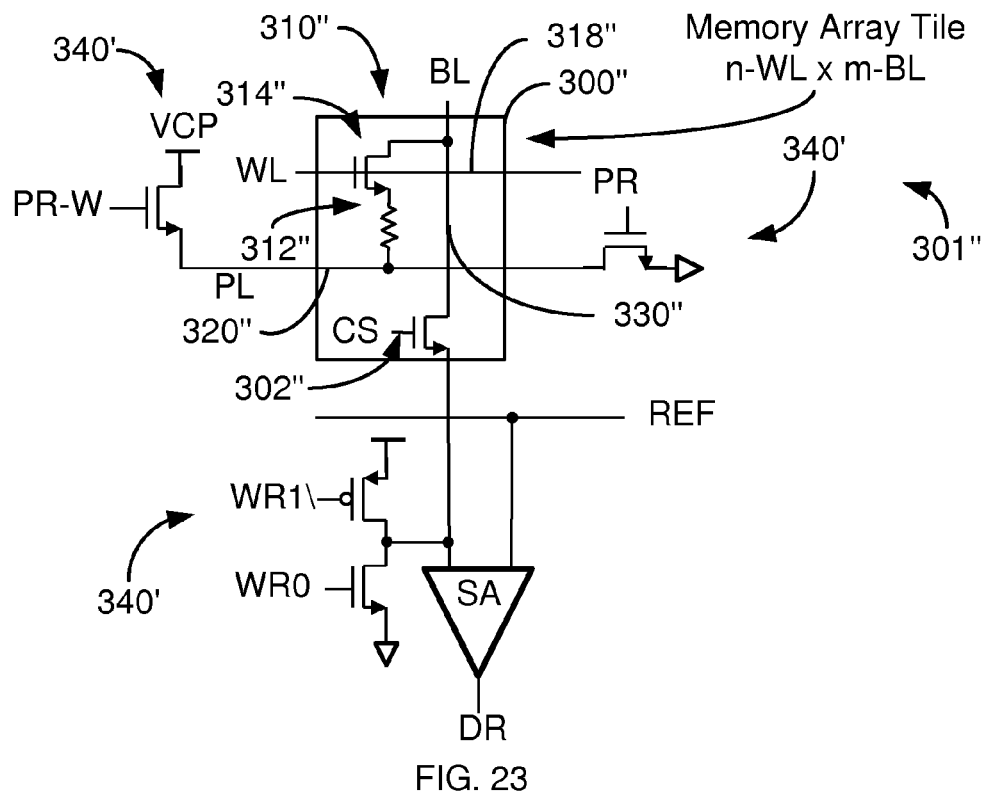
FIG. 23 depicts another exemplary embodiment of a portion of a magnetic memory employing the spin transfer effect in connection with the spin-orbit interaction for switching.
Figure 24:
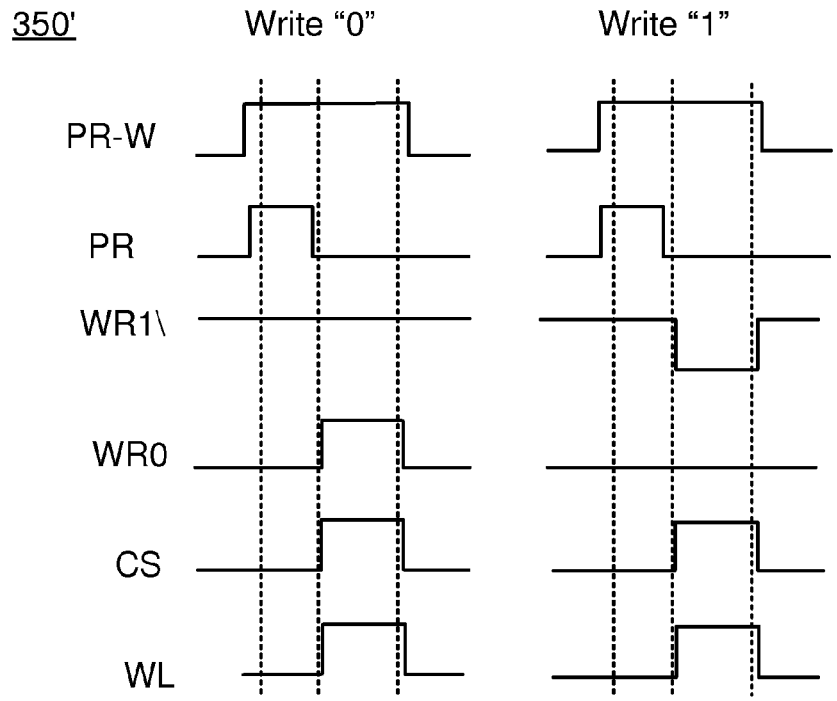
FIG. 24 depicts an exemplary embodiment of a timing diagram for an exemplary embodiment of a portion of a magnetic memory employing the spin transfer effect in connection with the spin-orbit interaction for switching.

FIG. 23 depicts another exemplary embodiment of a portion of a magnetic memory 300" employing the spin transfer effect in connection with the spin-orbit interaction for switching. FIG. 24 depicts an exemplary embodiment of a timing diagram 350' used in writing a logical 0 (Write "0") and writing a logical 1 (Write "1") for an exemplary embodiment of a portion of the magnetic memory 300". The memory 300" is analogous to the memories 100, 150, 200s, 300 and 300'. Consequently, analogous components are similarly labeled. The memory 300" includes MAT 301" that is part of a subarray, intermediate circuitry 340', and intermediate bit lines (e.g. carrying REF signal) that are analogous to the MATs 180, 180', 201s, 301 and 301', intermediate circuitry 172, 172', 240s, 340 and intermediate bit lines 174 and 174'. Also shown is sense amplifier SA that outputs read data DR. Other portions of the memory 300", such as other MATs in the subarray, and global circuitry, are not shown. Consequently, the memory 300" may include subarray(s) (not explicitly denoted), global bit lines (not shown) and global circuitry (not shown) that may be analogous to the subarray 170 and 170', global bit lines 162, 164, 166, 168, 166' and 168', and global circuitry 160, respectively. For clarity, only one MAT 301" is shown. Although only one word line 318" and one bit line BL 330" are labeled, the MAT (memory array tile) is indicated as including n word lines and m bit lines (nWL× mBL). The MAT 301" includes memory cells 310" including at least one magnetic junction 312" and at least one selection device 314" analogous to the memory cells 102, 190, 210s, 310 and 310', magnetic junctions 110, 192, 212s, 312 and 312' and the selection devices 104, 194, 214s, 314 and 314', respectively. Although not shown, the MAT 301" also includes an SO active layer analogous to the SO active layer 122. The SO active layer may adjoin the free layer of the magnetic junction 312". The MAT 301" also includes common buses (PL) 320" and bit lines 330" that are analogous to common buses 182, 182', 220s, 320 and 320' and bit/source line 184, 230s, 330 and 330', respectively. The common buses 320" are so termed because these lines are coupled with the magnetic junction 312". The common buses 320" thus would include, be adjacent to, and/or drive the SO active layers (not shown) that are used in writing to the magnetic junctions 312" via SO torque. The memory 300" also includes gates 302" driven by signals CS. Note that in the memory 300", the common buses 320" are perpendicular to the bit lines 330" and parallel to the word lines 318".

Referring to FIGS. 23 and 24, intermediate circuitry 340' may be controlled by signals provided via global bit lines (not shown). Note that two labels 340' are shown in FIG. 23 because these components are part of the same intermediate circuitry 340' despite being separated in the drawing for clarity. Further local sense amplifier SA may be used to read data. Signal PR-W is used to enable the common bus 320". Signal CS enables the bit line 330" for writing to the cell 310". More specifically, the common bus 320" is enabled to carry a precharge current via signal PR-W. As can be seen from the signal PR-W in the timing diagram 350 and the connection between VCP and the common bus 320", the current may be driven through the common bus 320" in the same direction even if different data are written. Thus, the precharge/SO current is a unidirectional current. This precharge current perturbs the magnetic moment of the free layer from the easy axis. The word line 318" and bit line 330" are then enabled to drive the STT current through the bit line 330", the magnetic junction 312" and the common bus 320". The order in which the write current traverses the components 330", 312" and 320" depends upon the data being written. In some embodiments, this write current is driven perpendicular to plane through the magnetic junction before the magnetic moment can decay back to equilibrium. Thus, the magnetic junction 312" may be written using a combination of SO interaction and STT. Further, the memory cells 310" along a row may be written by cycling through the columns/enabling the bit lines 330".

The memory 300" shares the benefits of the memories 100, 150, 170', 200s, 300 and 300'. In particular, the use of SO torque may be used in switching the magnetic junction 312". The spin-orbit torque switching in conjunction with STT switching, may reduce the switching time and write error rate. The memory 300" is hierarchical and modular in nature. The memory 300" may thus be easily extended to larger sizes and/or higher densities. The circuitry may be duplicated and added to build larger memories. Consequently, the memory 300" may be usable in higher density memories. Further, in some embodiments, an entire row may be written in a pass. As a result, read disturb for the memory 300" may be reduced or avoided. In addition, fewer transistors may be used than, for example, the memory 300'.

Figure 25:
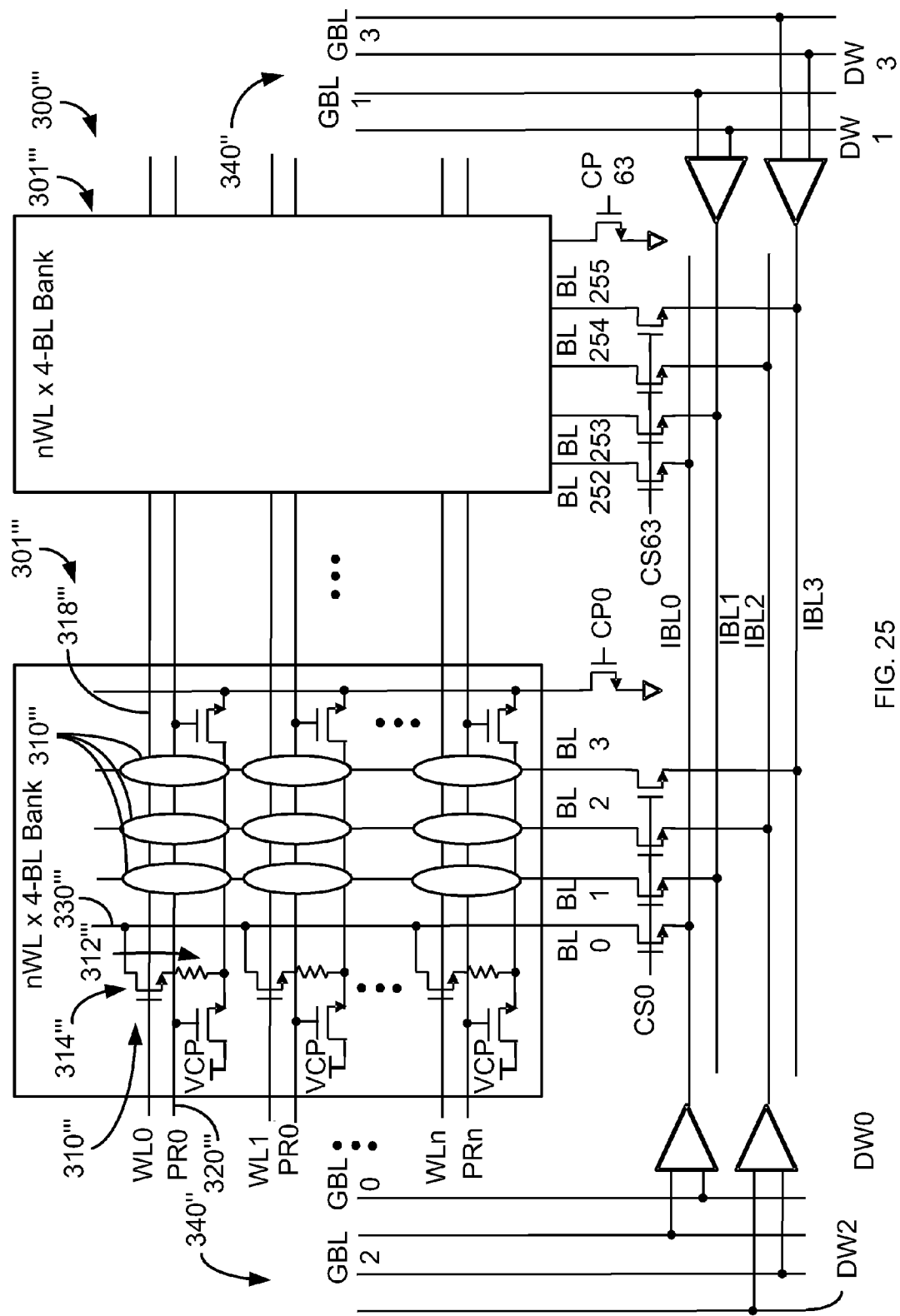
FIG. 25 depicts another exemplary embodiment of a portion of a magnetic memory employing the spin transfer effect in connection with the spin-orbit interaction for switching.

FIG. 25 depicts another exemplary embodiment of a portion of a magnetic memory 300''' employing the spin transfer effect in connection with the spin-orbit interaction for switching. The memory 300''' is analogous to the memories 100, 150, 200s, 300, 300' and 300". Consequently, analogous components are similarly labeled. The memory 300''' includes MATs 301''' that are formed into two banks in the embodiment shown. Each bank is n word lines deep (i.e. has n rows) and 4 bit lines wide (i.e. has 4 columns). Thus, each bank for the MAT 301''' is labeled as a nWL×4-BL Bank. However, in another embodiment, each bank/MAT 301''' may have another number of rows and/or columns. The memory 300'''' also includes intermediate circuitry 340", and intermediate bit lines IBL0, IBL1, IBL2 and IBL3 that are analogous to the MATs 180, 180', 201s, 301 and 301', intermediate circuitry 172, 172', 240s, 340 and 340' and intermediate bit lines 174 and 174'. Other portions of the memory 300''', such as other MATs, and global circuitry, are not shown. Consequently, the memory 300''' may include subarray(s), global bit lines (not shown) and global circuitry (not shown) that may be analogous to the subarray 170 and 170', global bit lines 162, 164, 166, 168, 166' and 168', and global circuitry 160, respectively. For clarity, only two MATs 301''' are shown. Each MAT 301''' includes memory cells 310''' including at least one magnetic junction 312''' and at least one selection device 314''' analogous to the memory cells 102, 190, 210s, 310, 310' and 310", magnetic junctions 110, 192, 212s, 312, 312' and 312''' and the selection devices 104, 194, 214s, 314, 314' and 314", respectively. Although not shown, the MAT 301''' also includes an SO active layer analogous to the SO active layer 122. The SO active layer may adjoin the free layer of the magnetic junction 312'''. The MAT 301''' also includes common buses 320''' (PRi where i is from 0 through n)) and bit lines 330''' that are analogous to common buses 182, 182', 220s, 320, 320' and 320" and bit/source line 184, 230s, 330, 330' and 330", respectively. The common buses 320''' are so termed because these lines are coupled with the magnetic junction 312'''. The common buses 320''' thus would include, be adjacent to, and/or drive the SO active layers (not shown) that are used in writing to the magnetic junctions 312''' via SO torque. The memory 300''' also includes gates 302" driven by signals CS. Note that in the memory 300", the common buses 320" are perpendicular to the bit lines 330" and parallel to the word lines 318".

Intermediate circuitry 340" may be controlled by signals provided via global bit lines (such as GBL 0, GBL 1, GBL 2 and GBL 3 and lines DW 0, DW 1, DW 2 and DW3). Control signals such as CP0, CP63, CS0, CS63, DW0, DW1, DW2 and DW3 may also be used in controlling the banks. Note that two labels 340" are shown in FIG. 25 because these components are part of the same intermediate circuitry 340" despite being separated in the drawing for clarity. Like the memories 300, 300' and 300", the common buses 320" are enabled to carry a precharge current. The current may be driven through the common bus 320" in the same direction even if different data are written. Thus, the precharge/SO current may be a unidirectional current that perturbs the magnetic moment of the free layer from the easy axis. The word line 318''' and bit line 330''' are then enabled to drive the STT current through the magnetic junction 312" in the appropriate direction for the data being written. Thus, the magnetic junction 312''' may be written using a combination of SO interaction and STT. Further, the memory cells 310''' along a row may be written by cycling through the columns/enabling the bit lines 330'''.

The memory 300" shares the benefits of the memories 100, 150, 170', 200s, 300, 310' and 300". In particular, the use of SO torque may be used in switching the magnetic junction 312'''. The spin-orbit torque switching in conjunction with STT switching, may reduce the switching time and write error rate. The memory 300''' is hierarchical and modular in nature. The memory 300''' may thus be easily extended to larger sizes and/or higher densities. The circuitry may be duplicated and added to build larger memories. Consequently, the memory 300''' may be usable in higher density memories. Further, in some embodiments, an entire row may be written in a pass. As a result, read disturb for the memory 300''' may be reduced or avoided.

Figure 26:
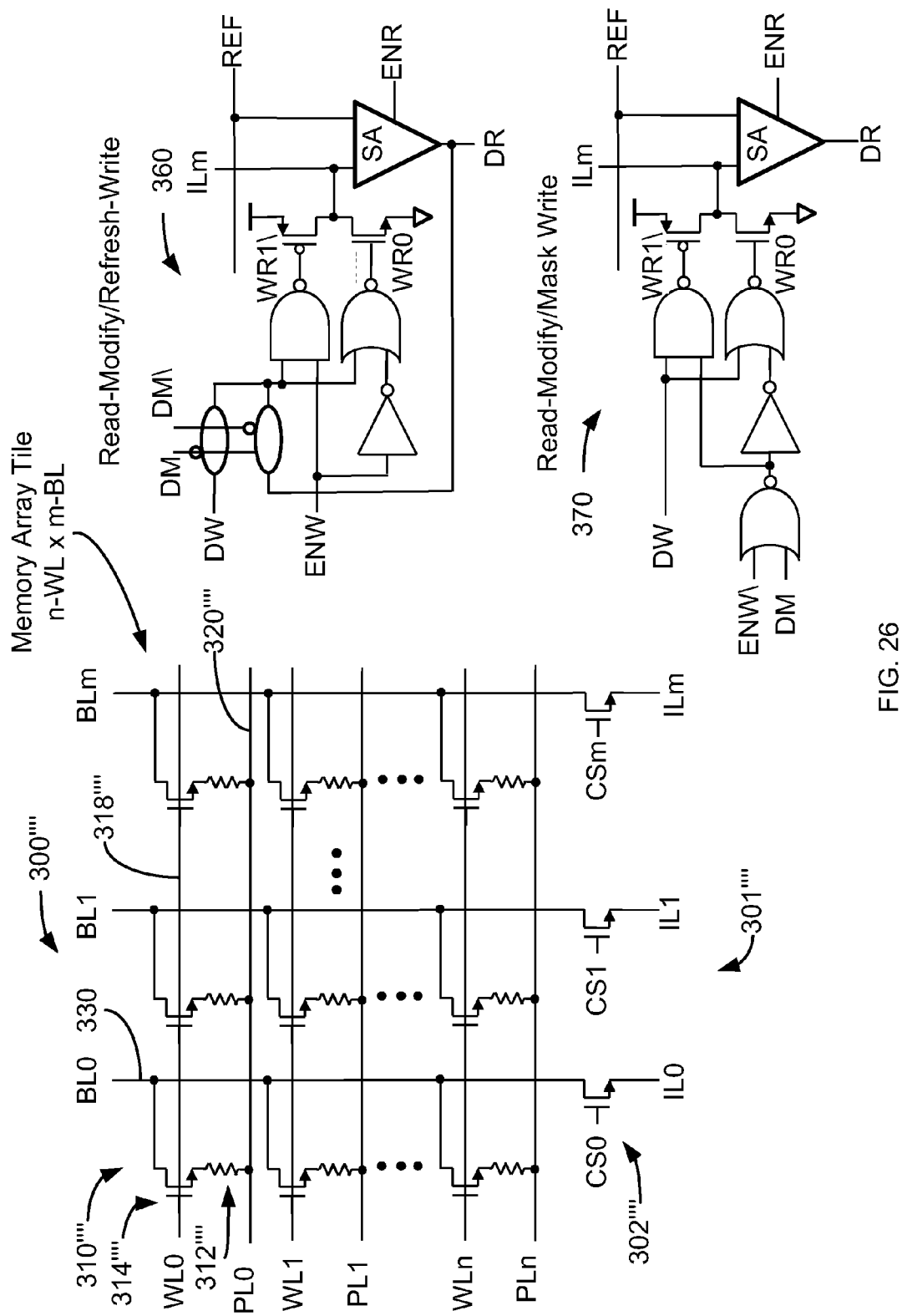
FIG. 26 depicts another exemplary embodiment of a portion of a magnetic memory employing the spin transfer effect in connection with the spin-orbit interaction for switching.

FIG. 26 depicts another exemplary embodiment of a portion of a magnetic memory 300'''' employing the spin transfer effect in connection with the spin-orbit interaction for switching. The memory 300'''' is analogous to the memories 100, 150, 200s, 300, 300', 300" and 300'''. Consequently, analogous components are similarly labeled. The memory 300'''' includes MAT 301'''' that is analogous to the MAT 301 depicted in FIG. 20. However, in another embodiment, other MATs including but not limited to the MATs 180, 180', 201s, 301, 301' and 301". Other portions of the memory 300'''', such as other MATs, certain intermediate circuitry and global circuitry, are not shown. Each MAT 301'''' includes memory cells 310'''' including at least one magnetic junction 312'''' and at least one selection device 314'''' analogous to the memory cells 102, 190, 210s, 310, 310', 310" and 310''', magnetic junctions 110, 192, 212s, 312, 312', 312" and 312'''', and the selection devices 104, 194, 214s, 314, 314', 314" and 314''', respectively. Although not shown, the MAT 301'''' also includes an SO active layer analogous to the SO active layer 122. The SO active layer may adjoin the free layer of the magnetic junction 312''''. The MAT 301'''' includes common buses 320'''' and bit lines 330'''' that are analogous to common buses 182, 182', 220s, 320, 320', 320" and 320" and bit/source line 184, 230s, 330, 330', 330" and 330''', respectively. For simplicity, only lines PL1, PL2 and PLm, bit lines BL1, BL1 and BLm, and corresponding control signals CS0, CS1 and CSm are labeled. Also shown is sense amplifier SA that outputs read data DA. The common buses 320'''' may include, be adjacent to, and/or drive the SO active layers (not shown) that are used in writing to the magnetic junctions 312'''' via SO torque. The memory 300'''' also includes gates 302'''' driven by signals CS. Note that in the memory 300'''', the common buses 320''' are perpendicular to the bit lines 330''' and parallel to the word lines 318'''.

In general, the memory 300'''' functions in an analogous manner to the memories 300, 300', 300" and 300'''. However, the memory 300'''' also includes write driver circuit with refresh and write masking functions 360 and 370. The write drivers 360 and/or 370 may be used in connection with writing to the memory 300''''. In some other embodiments, the circuits 360 and/or 370 may be used with other memories including but not limited to the memories 100, 150, 200s, 300, 300', 300" and 300'''. The circuit 360 can be used for read followed by write (read-modify-write) or read followed by refresh (re-write same data) by toggling DM and DM\ appropriately. The circuit 370 can be used to mask the write operation by activating DM. A read operation can follow a write operation (read-modify-write) in an n-bit wide parallel memory access. One or more bits may be masked from being modified by activating each DM signal to those bits. Similarly, DM can be active during a write operation. Those bits with DM active are masked and remained unmodified. For n-bits, there will be DM<0>, DM<1>, DM<2>, . . . . DM<n–1>, to control each write driver circuit.

The memory 300'''' shares the benefits of the memories 100, 150, 170', 200s, 300, 310', 300" and 300'''. In particular, the use of SO torque may be used in switching the magnetic junction 312''''. The spin-orbit torque switching in conjunction with STT switching may reduce the switching time and write error rate. The memory 300'''' is hierarchical and modular in nature. The memory 300'''' may thus be easily extended to larger sizes and/or higher densities. The circuitry may be duplicated and added to build larger memories. Consequently, the memory 300'''' may be usable in higher density memories. Further, in some embodiments, an entire row may be written in a pass. As a result, read disturb for the memory 300'''' may be reduced or avoided. In addition, masks 360 and/or 370 may be used to control the cells being written.

Figure 27:
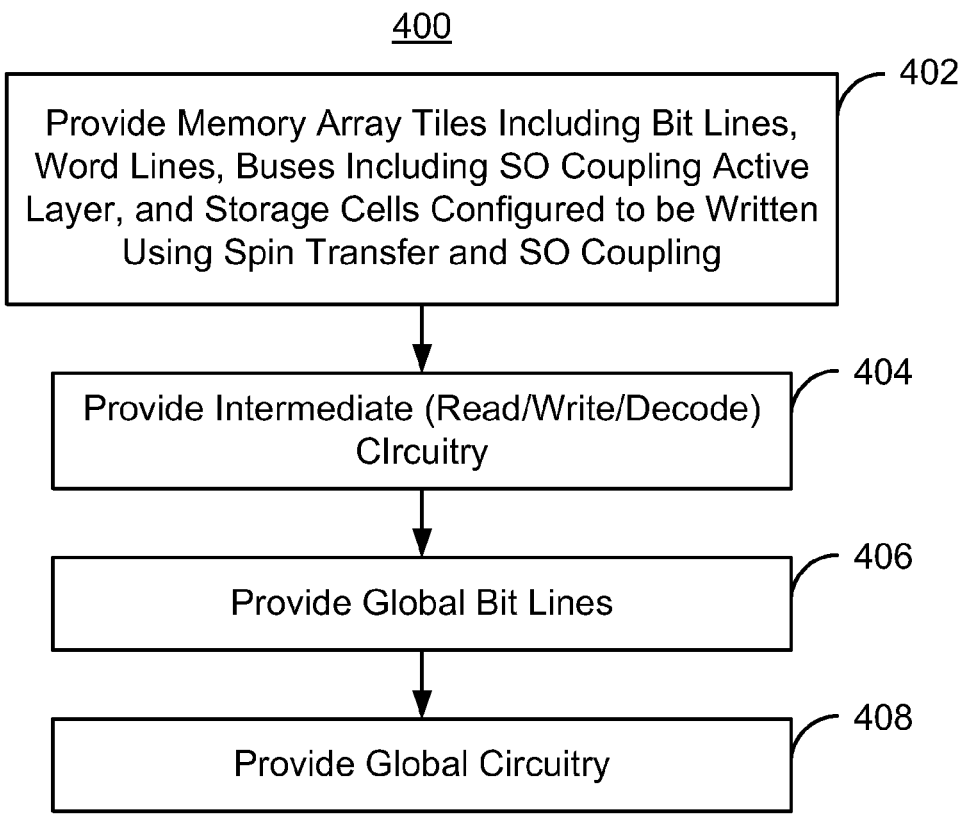
FIG. 27 is a flow chart depicting an exemplary embodiment of a method for providing another exemplary embodiment of a portion of a magnetic memory employing the spin transfer effect in connection with the spin-orbit interaction for switching.

FIG. 27 is a flow chart depicting an exemplary embodiment of a method 400 for providing a magnetic memory having magnetic junction(s) switched using spin-orbit interaction. For simplicity, some steps may be omitted, combined, and/or interleaved. The method 400 is described in the context of the magnetic memory 100. However, the method 400 may be used to provide other magnetic memories including but not limited to the magnetic memories 200, 200', 200", 200''', 200'''', 200''''', 200'''''', 300, 300', 300", 300''' and/or 300''''.

The MATs 180 are provided for the memory, via step 402. Step 402 includes forming memory cells 190, magnetic junctions 192, common buses 182 and bit lines 182. Word lines and other circuitry for the MAT 180 are also provided in step 402. Intermediate circuitry such as the circuitry 172', is provided, via step 404. Global bit lines and global circuitry may then be provided in steps 406 and 408, respectively.

Thus, using the method 400, the benefits of one or more of the magnetic memories 200, 200', 200", 200''', 200'''', 200''''', 200'''''', 300, 300', 300", 300''' and/or 300'''' may be fabricated. Consequently, the benefits of one or more of the memories 200, 200', 200", 200''', 200'''', 200''''', 200'''''', 300, 300', 300", 300''' and/or 300'''' may be achieved.

Figure 28:
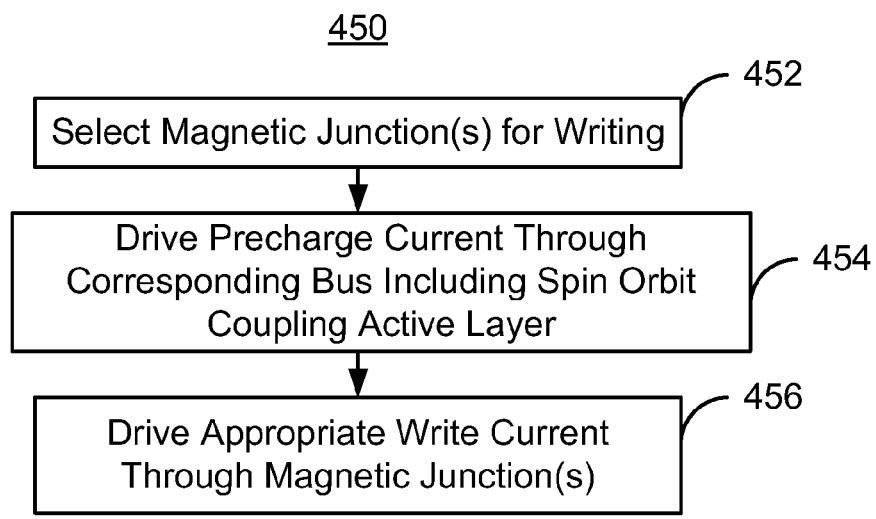
FIG. 28 is a flow chart depicting an exemplary embodiment of a method for programming magnetic junction(s) switched using spin-orbit interaction.

FIG. 28 is a flow chart depicting an exemplary embodiment of a method 450 for programming magnetic junction(s) switched using spin-orbit interaction. The method 450 may be used with one or more of the memories 200, 200', 200", 200''', 200'''', 200''''', 200'''''', 300, 300', 300", 300''' and/or 300''''. For simplicity, some steps may be omitted, combined, and/or interleaved. The method 450 is described in the context of the magnetic memory 100. However, the method 450 may be used with other magnetic junctions including but not limited to the magnetic memories 100, 100', 100", 100''', 200, 200', 200", 200''', 200'''', 250, 300, 300', 300''', and/or 300''''.

The magnetic junction(s) desired to be written are selected, via step 452. In some embodiments, step 452 is performed by some combination decoding circuitry, intermediate circuitry, global circuitry, and/or masks. Thus, the desired section of the MAT(s) to be programmed is determined in step 402.

A precharge current is driven through the common bus(es) for the selected magnetic junction(s), via step 454. The precharge current is generally an in-plane spin-orbit write current. Step 454 typically includes activating the common bus with the signal to the appropriate gate and driving the current through the common bus(es). In some embodiments, the precharge current driven in step 454 is a unidirectional current, while in other embodiments the precharge current may be bidirectional. The precharge current may be applied as a pulse. The duration and rise of the pulse may be desired to be short, for example not more than 0.1-3 nanoseconds for spin-orbit interaction assisted switching. In other embodiments, other pulse durations may be used. The precharge current driven in step 454 may be used to perturb the selected magnetic junction from equilibrium.

A spin transfer torque write current is optionally driven through the magnetic junction, via step 456. The current in step 456 may also be applied as a pulse. Step 456 may be accomplished by enabling the appropriate bit/source lines and word lines. Thus, the writing of the cells may be completed using steps 452 and 454.

Thus, using the method 450, the magnetic memories 200, 200', 200", 200''', 200'''', 200''''', 200'''''', 300, 300', 300", 300''' and/or 300'''' may be programmed. Thus, the benefits of the magnetic memories 200, 200', 200", 200''', 200'''', 200''''', 200'''''', 300, 300', 300", 300''' and/or 300'''' may be achieved.

A method and system for providing a magnetic memory employing the SO interaction and which is hierarchical and/or modular has been described. Various combinations of features in the magnetic memories 200, 200', 200", 200''', 200'''', 200''''', 200'''''', 300, 300', 300", 300''' and/or 300'''' may be combined. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic memory comprising:
a plurality of memory array tiles (MATs), each of the plurality of MATs including a plurality of bit lines, a plurality of word lines and a plurality of magnetic storage cells, each of the plurality of magnetic storage cells including at least one magnetic junction, at least one selection device and at least a portion of a spin-orbit interaction (SO) active layer adjacent to the at least one magnetic junction, the at least the portion of the SO active layer configured to exert a SO torque on at least a portion of the at least one magnetic junction due to at least one SO current passing through the at least the portion of the SO active layer, the at least one magnetic junction being programmable using at least one write current driven through the at least one magnetic junction and the at least one SO current provided to the at least the portion of the SO active layer, the plurality of bit lines and the plurality of word lines corresponding to the plurality of magnetic storage cells;
intermediate circuitry for controlling read operations and write operations within the plurality of MATs;
a plurality of global bit lines, each of the global bit lines corresponding to a portion of the plurality of MATs;
global circuitry for selecting and driving a portion of the plurality of global bit lines for the read operations and the write operations.

2. The magnetic memory of claim 1 wherein each of the at least one magnetic junction includes a reference layer, a nonmagnetic spacer layer, and a free layer, the free layer being magnetic, the nonmagnetic spacer layer being between the reference layer and the free layer and wherein the at least the portion of the SO active layer is adjacent to the free layer.

3. The magnetic memory of claim 1 wherein each of the plurality of MATs includes a plurality of common buses, each of the plurality of common buses coupled with a portion of the plurality magnetic junctions, including the portion of the SO active layer and for carrying the SO current.

4. The magnetic memory of claim 3 wherein the SO current is a preconditioning current.

5. The magnetic memory of claim 4 wherein the preconditioning current is a bi-directional current having a direction depending on data being written to a portion of the plurality of magnetic junctions.

6. The magnetic memory of claim 4 wherein the preconditioning current is a unidirectional current.

7. The magnetic memory of claim 3 wherein the plurality of common buses correspond to a plurality of source lines and wherein the plurality of word lines are coupled with the plurality of selection devices and the plurality of bit lines coupled with the plurality of selection devices.

8. The magnetic memory of claim 7 wherein the plurality of bit lines are perpendicular to the plurality of common buses.

9. The magnetic memory of claim 7 wherein the plurality of bit lines are parallel to the plurality of common buses.

10. The magnetic memory of claim 3 wherein the plurality of bit lines, the plurality of word lines and the plurality of common buses are configured such that any magnetic storage cell of the plurality of magnetic storage cells may be individually selected for reading and writing.

11. The magnetic memory of claim 3 wherein the plurality of bit lines, the plurality of word lines and the plurality of common buses are configured such that a particular number of the plurality of magnetic storage cells may be selected for reading and writing as a group.

12. The magnetic memory of claim 3 wherein the intermediate circuitry, the plurality of bit lines, the plurality of word lines and the plurality of common buses are configured such that a portion of the plurality of magnetic storage cells may be read, modified and re-written.

13. The magnetic memory of claim 12 wherein the intermediate circuitry further includes read-modify-write mask circuitry.

14. The magnetic memory of claim 3 wherein the intermediate circuitry, the plurality of bit lines, the plurality of word lines and the plurality of common buses are configured such that a portion of the plurality of magnetic storage cells may be read only and refreshed.

15. The magnetic memory of claim 14 wherein the intermediate circuitry further includes refresh and write mask circuitry.

16. The magnetic memory of claim 1 wherein the intermediate circuitry further includes a plurality of intermediate drive/sense circuitry and local decoding circuitry, the plurality of intermediate driver/sense circuitry for driving at least one of read operations and write operations in the plurality of MATs, each of the plurality of intermediate drive/sense circuitry corresponding to a third portion of the plurality of MATs, the local decoding circuitry for selecting at least one selected MAT of the plurality of MATs and at least one of the storage cells in the at least one selected MAT.

17. The magnetic memory of claim 15 wherein the intermediate circuitry further includes:
a plurality of intermediate read drivers and a plurality of intermediate write drivers, each of the plurality of intermediate read drivers for controlling read operations in a third portion of the plurality of MATs and each of the plurality of write drivers for driving the write operations in a fourth portion of the plurality of MATs.

18. The magnetic memory of claim 1 wherein
wherein the plurality of global bit lines has a first resistance, the plurality of word lines has a second resistance, and the plurality of bit lines has a third resistance, the first resistance being less than the second resistance and the third resistance.

19. The magnetic memory of claim 1 wherein the plurality of MATs further includes:
a first bank; and
a second bank different from the first bank.

20. The magnetic memory of claim 1 wherein at least a portion of the plurality of storage cells includes a single transistor and a single magnetic junction.

21. A magnetic memory comprising:
a plurality of memory array tiles (MATs), each of the plurality of MATs including a plurality of magnetic storage cells, a plurality of bit lines, a plurality of word lines and a plurality of common buses for carrying a preconditioning current, each of the plurality of magnetic storage cells including at least one magnetic junction and at least one selection device and at least a portion of a spin-orbit interaction (SO) active layer adjacent to the at least one magnetic junction, the at least the portion of the SO active layer configured to exert a SO torque on at least a portion of the at least one magnetic junction due to the preconditioning current passing through the at least the portion of the SO active layer, each of the plurality of common buses coupled with a portion of the plurality magnetic junctions, including the portion of the SO active layer and for carrying the preconditioning current;
the at least one magnetic junction being programmable using at least one write current driven through the at least one magnetic junction and the preconditioning current provided to the at least the portion of the SO active layer, the plurality of bit lines and the plurality of word lines corresponding to the plurality of magnetic storage cells;
intermediate circuitry for controlling read operations and write operations within the plurality of MATs, the intermediate circuitry further including at intermediate drive/sense circuitry and local decoding circuitry;
a plurality of global bit lines, each of the global bit lines corresponding to a portion of the plurality of MATs, the plurality of global bit lines having a first resistance, the plurality of word lines having a second resistance, and the plurality of bit lines having a third resistance, the first resistance being less than the second resistance and the third resistance;
global circuitry for selecting and driving a portion of the plurality of global bit lines for the read operations and the write operations.

22. A method for providing a magnetic memory comprising:
providing a plurality of memory array tiles (MATs), each of the plurality of MATs including a plurality of bit lines, a plurality of word lines and a plurality of magnetic storage cells, each of the plurality of magnetic storage cells including at least one magnetic junction, at least one selection device and at least a portion of a spin-orbit interaction (SO) active layer adjacent to the at least one magnetic junction, the at least the portion of the SO active layer configured to exert a SO torque on at least a portion of the at least one magnetic junction due to a SO current passing through the at least the portion of the SO active layer, the at least one magnetic junction being programmable using at least one write current driven through the at least one magnetic junction and the SO current provided to the at least the portion of the SO active layer, the plurality of bit lines and the plurality of word lines corresponding to the plurality of magnetic storage cells;
providing intermediate circuitry for controlling read operations and write operations within the plurality of MATs;
providing a plurality of global bit lines, each of the global bit lines corresponding to a portion of the plurality of MATs; and
providing global circuitry for selecting and driving a portion of the plurality of global bit lines for the read operations and the write operations.

23. A method for programming a magnetic memory including a plurality of magnetic junctions, each of the plurality of magnetic junctions including a data storage layer, the data storage layer being magnetic the method comprising:
driving a precharge current through at least one of a plurality of common buses in at least one memory array tile of a plurality of memory array tiles (MATs), each of the plurality of MATs including the plurality of common buses, a plurality of bit lines, a plurality of word lines and a plurality of magnetic storage cells, each of the plurality of common buses including at least a portion of a spin-orbit interaction (SO) active layer adjacent to the magnetic junction, each of the plurality of magnetic storage cells including at least one magnetic junction, at least one selection device and at least a portion of a spin-orbit interaction (SO) active layer adjacent to the magnetic junction, the at least the portion of the SO active layer configured to exert a SO torque on at least a portion of the magnetic junction due to a preconditioning current passing through the at least the portion of the SO active layer, the at least one magnetic junction being programmable using at least one write current driven through the at least one magnetic junction and the preconditioning current provided to the at least the portion of the SO active layer, the plurality of bit lines and the plurality of word lines corresponding to the plurality of magnetic storage cells, the at least one of the plurality of common buses corresponding to at least one selected magnetic storage cell of the plurality of magnetic storage cells;

driving the at least one write current through the at least one magnetic junction of the at least one selected magnetic storage cell.

24. The method of claim 22 further comprising:
selecting the at least one selected magnetic storage cell.

25. The method of claim 23 wherein the step of selecting the at least one selected magnetic storage cell is performed using intermediate circuitry corresponding to at least one of the plurality of MATs, the at least one of the plurality of MATs including the selected magnetic storage cell.

* * * * *